(12) United States Patent
Tang et al.

(10) Patent No.: US 11,056,476 B2
(45) Date of Patent: Jul. 6, 2021

(54) MICROCONTROLLER UNIT AND FABRICATION METHOD THEREOF

(71) Applicant: Ningbo Semiconductor International Corporation, Ningbo (CN)

(72) Inventors: Ying Tang, Ningbo (CN); Xiaolin Yuan, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 15 days.

(21) Appl. No.: 16/715,229

(22) Filed: Dec. 16, 2019

(65) Prior Publication Data

US 2020/0212028 A1    Jul. 2, 2020

Related U.S. Application Data

(63) Continuation of application No. PCT/CN2019/081074, filed on Apr. 2, 2019.

(30) Foreign Application Priority Data

Dec. 29, 2018 (CN) .......................... 201811647753.6

(51) Int. Cl.
*H01L 25/18* (2006.01)
*H01L 23/528* (2006.01)
(Continued)

(52) U.S. Cl.
CPC ............ *H01L 25/18* (2013.01); *H01L 23/528* (2013.01); *H01L 24/03* (2013.01); *H01L 24/05* (2013.01); *H01L 24/20* (2013.01); *H01L 24/24* (2013.01); *H01L 24/82* (2013.01); *H01L 25/50* (2013.01); *H01L 2224/04105* (2013.01); *H01L 2224/211* (2013.01); *H01L 2224/24145* (2013.01);
(Continued)

(58) Field of Classification Search
CPC ....... H01L 25/18; H01L 25/50; H01L 23/528; H01L 24/03; H01L 24/05; H01L 24/20; H01L 24/24; H01L 24/82; H01L 2224/04105; H01L 2224/211; H01L 2224/24145; H01L 2224/82801; H01L 2924/1431
USPC .......................................................... 257/774
See application file for complete search history.

(56) References Cited

U.S. PATENT DOCUMENTS

2013/0051116 A1* 2/2013 En ........................... H01L 25/18
365/148

* cited by examiner

*Primary Examiner* — Tong-Ho Kim
(74) *Attorney, Agent, or Firm* — Anova Law Group, PLLC

(57) ABSTRACT

The present disclosure provides a microcontroller unit and its fabrication method. The microcontroller unit includes a logic control substrate, and also includes at least one memory die and at least one non-memory die, which are disposed on the logic control substrate. The logic control substrate includes a semiconductor device layer and an interconnection dielectric layer. A central processing unit and at least one logic controller are formed in the semiconductor device layer. All memory dies are disposed on the interconnection dielectric layer side by side or stacked one over another, and the at least one memory die is electrically connected to the central processing unit through a corresponding electrical interconnection structure in the interconnection dielectric layer. All non-memory dies are disposed on the interconnection dielectric layer side by side or stacked one over another and are electrically connected to corresponding logic controllers through corresponding electrical interconnection structures in the interconnection dielectric layer.

20 Claims, 7 Drawing Sheets

(51) Int. Cl.
*H01L 23/00* (2006.01)
*H01L 25/00* (2006.01)
(52) U.S. Cl.
CPC ............... *H01L 2224/82801* (2013.01); *H01L 2924/1431* (2013.01); *H01L 2924/1432* (2013.01); *H01L 2924/1434* (2013.01)

MICROCONTROLLER UNIT AND FABRICATION METHOD THEREOF

CROSS-REFERENCES TO RELATED APPLICATIONS

This application is a continuation application of PCT Patent Application No. PCT/CN2019/081074, filed on Apr. 2, 2019, which claims priority to Chinese patent application No. 201811647753.6, filed on Dec. 29, 2018, the entirety of all of which is incorporated herein by reference.

FIELD OF THE DISCLOSURE

The present disclosure generally relates to the field of integrated circuit manufacturing, and more particularly, relates to a microcontroller unit and its fabrication method.

BACKGROUND

A microcontroller unit (MCU), also known as a single chip microcomputer, is an integrated circuit level computer formed by appropriately reducing the frequency and specification of a central processing unit (CPU, also called logic core), and integrating basic modules, such as a memory, a timer, an input/output (I/O) module, various interfaces (e.g., a debug interface, a USB interface), other control algorithm modules, and the like, and extended functional modules, such as a microelectromechanical systems (MEMS) sensor or a radio frequency (RF) communication module, on a single integrated circuit, which may be combined differently for different application scenarios.

In the existing technology, the MCU may be fabricated by a system-in-a-package (SIP) method. For example, a plurality of functional dies, such as a central processing unit die, a memory die, and the like, and passive components are assembled side by side on a substrate; and the dies and the passive components are encapsulated by an injection mold process to implement a complete function of the MCU. That is, referring to FIG. 1A, in a current SIP layout, a central processing unit die 11a and a memory die 14a are distributed side by side on a substrate 100, which may be difficult to meet speed requirement of the primary storage for reduced instructions of the central processing unit of a current mainstream reduced instruction set computer (RISC) architecture.

In the existing technology, another method for fabricating the MCU is a system-on-a-chip (SoC), which is a current mainstream method. The mainstream of the central processing unit in the existing technology may be the RISC architecture, and the reduced instructions may have a high requirement on the primary storage speed. In order to ensure such requirement, each memory of the MCU may be required to be at least a primary memory (e.g. an instruction memory), which may be required to be electrically connected to the central processing unit directly. In addition, in order to reduce area and cost as much as possible, each module of the existing MCU may be integrated by the SoC method, and the layout characteristic of the SoC is that each module of the MCU may be distributed side by side in a semiconductor substrate. However, the solution still has the following defects.

(1) The SoC process used by the MCU may be the process compatibility result for fabricating each module included in the MCU, but in fact, processes for fabricating certain modules may be significantly different. For example, referring to FIG. 1B, the process of a logic portion 10, which includes a central processing unit (logic core) 11, a logic controller 12, an input/output module 13, and a plurality of interfaces and control algorithm modules, and the like, may be significantly from the process of the instruction memory in MCU1. When the MCU1 only has the logic portion 10, the number of layers in the MCU1 having the corresponding layout structures may be 28 to 30 (corresponding to 28 to 30 masks). When the MCU1 has other non-logic devices or modules in addition to the logic portion 10, the number of layers in the MCU1 having the corresponding layout structures may be increased correspondingly (i.e., five or more masks may be increased correspondingly). For example, after the logic portion 10 is compatible with an instruction memory 14, the number of the layers in the MCU1 having the corresponding layout structures may be changed from about 30 to about 40, and an increased additional layer 15 may have an electrical interconnection structure (not shown in FIG. 1B, also referred to as wiring) for electrically connecting the instruction memory 14 and the central processing unit 11. That is, the masks for fabricating the MCU1 may be changed from about 30 sheets to about 40 sheets, thereby resulting in a sharp increase in platemaking cost.

(2) The added layout layers due to different processes of some modules may objectively lead to that back-end layout layers of some modules in a back-end-of-line interconnection process may not have practical significance, and the wiring may not be required. However, in order to ensure consistency and stability of the process, it is necessary to add a large number of dummy structures in the corresponding back-end layout layers of the modules, but the dummy structures may waste materials and time. For example, as shown in FIG. 1B, when the MCU1 only has the logic portion 10, the number of layers in the MCU1 having the corresponding layout structures may be 28. After the central processing unit 11 is compatible with the instruction memory, the additional layer 15 with 5 layers having the corresponding back-end-of-line layout structures (i.e., wires electrically connecting the instruction memory 14 and the central processing unit 11) may be added to the MCU1. Currently, the added additional layer 15 (the total thickness is in micrometer level) may not be required for the modules other than the central processing unit 11 in the logic portion 10 of the MCU1. However, due to the planar process, an additional layer 16 may be formed on the top of the modules other than the central processing unit 11 in the logic portion 10, and the additional layer 16 may have a same number of layers and a same thickness as the additional layer 15 and a large number of the dummy structures (not shown in FIG. 1B) may be required to be placed in the additional layer 16, thereby causing waste.

(3) When the MCU is integrated by the SoC method, leads between the instruction memory and the central processing unit may be too long, which limits the increase of instruction access speed. For example, referring to FIG. 1B, since the MCU1 is integrated by the SoC method, the instruction memory 14 and the central processing unit 11 need to be horizontally arranged side by side, that is, the instruction memory 14 is separately encapsulated outside of the central processing unit 11, and an electrical interconnection structure (not shown in FIG. 1B, typically including conductive contact plugs and metal interconnection wires) for implementing the electrical connection between the instruction memory 14 and the central processing unit 11 may then be fabricated on the instruction memory 14, the central processing unit 11, the logic controller 12, and the input/output module 13. The electrical interconnection structure is formed in the additional layer 15. Obviously, the electrical interconnection structure includes a portion (not shown in FIG. 1B) leading out vertically and upwardly from the central processing unit 11, a portion (not shown in FIG. 1B) leading out vertically and upwardly from the instruction memory 14, and a horizontal portion (not shown in FIG. 1B) connected between the two portions. A length of the electrical interconnection structure may be excessively long with respect to the straight line between two points of the instruction memory 14 and the central processing unit 11 respectively, thereby causing a limited read and storage speed of the reduced instruction which may not be further improved.

BRIEF SUMMARY OF THE DISCLOSURE

The present disclosure provides a microcontroller unit and its fabrication method, which aims to reduce plate making cost and fabrication cost.

In addition, the present disclosure provides the microcontroller unit and its fabrication method, which aims to facilitate shortening the length of a lead connecting the memory and the central processing unit, thereby improving the access and storage speed of the control instructions.

One aspect of the present disclosure provides the microcontroller, including:

a logic control substrate, including a semiconductor device layer and an interconnection dielectric layer formed on the semiconductor device layer, where a central processing unit and at least one logic controller are formed in the semiconductor device layer, and electrical interconnection structures are formed in the interconnection dielectric layer for respectively leading out the central processing unit and the at least one logic controller; and at least one memory die and at least one non-memory die having a non-storage function, where all of the at least one memory die are disposed on the interconnection dielectric layer side by side or stacked one over another, and the at least one memory die is connected to a corresponding electrical interconnection structure in the interconnection dielectric layer to electrically connect to the central processing unit; and all of the at least one non-memory die are disposed on the interconnection dielectric layer side by side or stacked one over another, and are electrically connected to corresponding electrical interconnection structures in the interconnection dielectric layer to electrically connect to corresponding logic controllers.

Another aspect of the present disclosure provides the method for fabricating a microcontroller unit, including:

providing a logic control substrate, where the logic control substrate includes a semiconductor device layer and an interconnection dielectric layer stacked sequentially from bottom to top; forming a central processing unit and at least one logic controller in the semiconductor device layer; and forming electrical interconnection structures in the interconnection dielectric layer for respectively leading out the central processing unit and the at least one logic controller;

providing at least one memory die and at least one non-memory die having a non-storage function; disposing all of the at least one memory die on the interconnection dielectric layer side by side or stacked one over another; and disposing all of the at least non-memory die on the interconnection dielectric layer side by side or stacked one over another; and forming electrical connection structures, where the at least one memory die and the least one non-memory die are electrically connected to corresponding electrical interconnection structures respectively, such that the at least one memory die is electrically connected to the central processing unit, and the at least one non-memory die is electrically connected to the corresponding at least one logic controller.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1A:
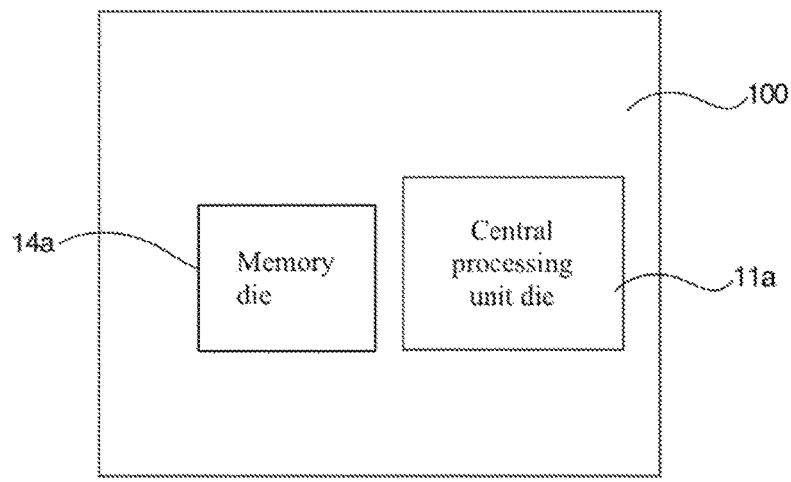
FIGS. 1A-1B illustrate schematics of forming microcontroller units (MCUs)
Figure 1B:
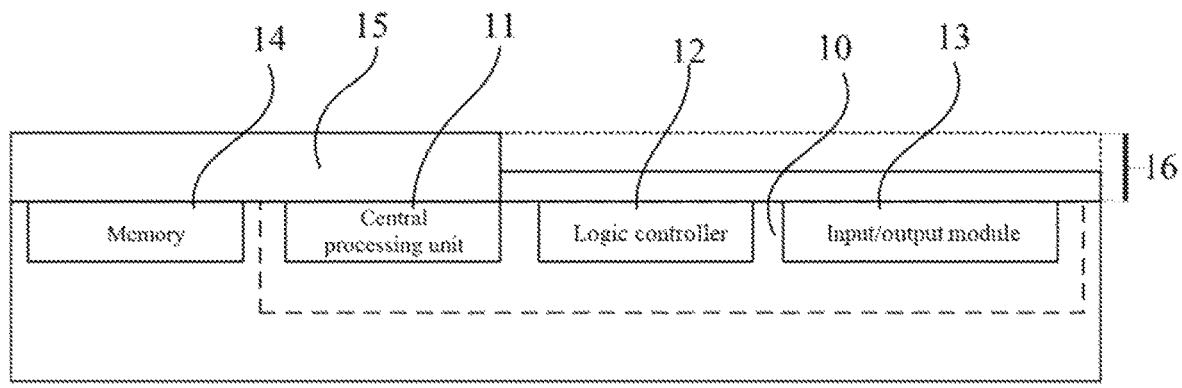

The technical solutions of the present disclosure may be further described in detail with reference to the accompanying drawings and embodiments thereinafter. Advantages and features of the present disclosure may be more apparent according to the above description. It should be noted that all accompanying drawings may be in a simplified form and a non-precise scale and may be merely for convenience and clarity of the purpose of the embodiments of the present disclosure. Similarly, if the method described herein includes a series of steps, the order of the steps presented herein may not necessarily the only order for implementing the steps, and some of the steps may be omitted and/or other steps which are not described herein may be added to the method. If components in one of accompanying drawings are the same as components in other accompanying drawings, the components may be easily recognized in all of the accompanying drawings, but reference numerals of all same components may not be labeled in each drawing to make the description of the accompanying drawings more apparent. Furthermore, the term "direct electrical connection" as used herein indicates that no other functional devices may be between a die and a central processing unit (or logic controller), and the die and the central processing unit may be connected through a wire structure such as an interconnection structure, a pad, a redistribution structure, and the like. The term "indirect electrical connection" as used herein indicates there may be another device between the die and the central processing unit (or logic controller) in addition to the wire structure such as an interconnection structure, a pad, a redistribution structure, and the like; that is, the die may be connected to the another device through the wire structure firstly, and then the another device may be connected to the central processing unit (or logic controller) by the wire structure.

Figure 2:
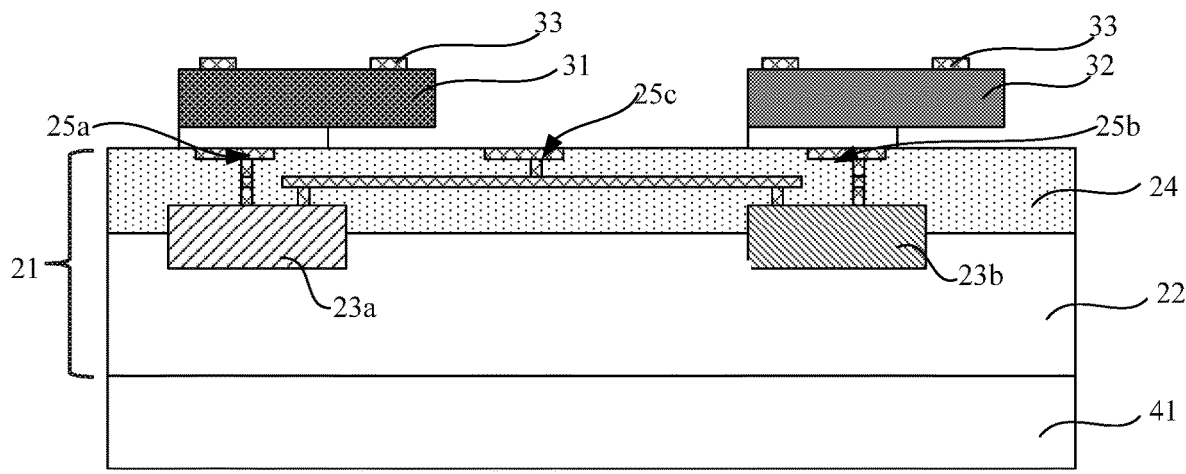
FIG. 2 illustrates a cross-sectional structural view of an MCU according to various embodiments of the present disclosure.

Referring to FIG. 2, one embodiment of the present disclosure provides a microcontroller unit including a carrier 41, a logic control substrate 21, an instruction set memory die 31, and a non-memory die 32 having a non-storage function. The instruction set memory die 31 and the non-memory die 32 may be arranged side by side, that is, laterally, on the logic control substrate 21. A gap may be between the instruction set memory die 31 and the non-memory die 32. "Laterally" herein may refer to a direction perpendicular to a thickness direction of the logic control substrate 21, and "arranged laterally" herein may refer to the extension and arrangement along a plate plane of the logic control substrate 21. The logic control substrate 21 may include a semiconductor device layer 22 and an interconnection dielectric layer 24 on the semiconductor device layer 22. A central processing unit 23a and a logic controller 23b may be formed in the semiconductor device layer 22. The central processing unit 23a and the logic controller 23b may have different control functions. Electrical interconnection structures 25a and 25b which respectively lead out the central processing unit 23a and the logic controller 23b may be formed in the interconnection dielectric layer 24. The instruction set memory die 31 may be used to access instructions of the central processing unit. The non-memory die 32 may be a die of having no storage function (or having a non-storage function). For example, the non-memory die may implement basic functions of the microcontroller unit other than the control functions or may implement extended functions required by the microcontroller unit. The basic functions may be, for example, an indication function, a radio frequency communication function, an analog-to-digital conversion function, a counting function, a digital-to-analog conversion function, and the like. The extended functions may be, for example, various sensor functions.

In one embodiment, the instruction set memory die 31 and the non-memory die 32 may be vertically soldered side by side on the interconnection dielectric layer 24. Projections of the instruction set memory die 31 and the central processing unit 23a on an upper surface of the interconnection dielectric layer 24 may have an overlapped region (not shown in FIG. 2). The instruction set memory die 31 and the central processing unit 23a may be vertically and electrically connected by the electrical interconnection structure 25a in the interconnection dielectric layer 24 of the overlapped region. The non-memory die 32 may be electrically connected to the logic controller 23b through the electrical interconnection structure 25b in the interconnection dielectric layer 24 outside of the overlapped region.

The instruction set memory die 31 may be a static random access memory (SRAM) die, a dynamic random access memory (DRAM) die, a flash die, an electrically erasable programmable read-only memory (EEPROM) die, a secure digital (SD) memory die, or a multimedia card (MMC) memory die. The MMC memory chip refers to a multimedia memory chip (or a multimedia memory card), which is a small (24×32 mm or 18×1.4 mm) erasable solid-state memory chip. The MMC memory chip may be applied to mobile phones, digital video and other mobile terminals, and the standard data carrier with high portability, high reliability and light weight may store up to 1 GB of information data, which is equivalent to the amount of information of 640,000 pages. For read-only applications, the MMC memory chip may be fabricated using ROM or flash memory technology. For both read and write applications, the MMC memory chip may be fabricated using flash memory technology. The SD memory chip is a memory chip jointly launched by Panasonic, Toshiba and SanDisk.

The non-memory die 32 may be a base portion of a conventional microcontroller unit other than the logic control portion, which is implemented by a chip (i.e., a die). The non-memory die 32 may be a radio frequency communication die, an analog to digital converter die, a digital to analog converter die, or a counter. The radio frequency communication die may be, for example, a near field communication (NFC) die, a Bluetooth die, a Wi-Fi die, a radio frequency identification chip (RFID) die, and the like. The analog to digital converter die may be used to process analog signals. The non-memory die 32 may also be a die which is functionally extended relative to the base portion of the MCU, including a MEMS sensor die or a sensor die fabricated by a process other than the MEMS process. The MEMS sensor die may be a die corresponding to a sensor, for example, a gyroscope, an accelerometer, an inertial sensor, a pressure sensor, a flow sensor, a displacement sensor, an electric field sensor, an electric field strength sensor, a current sensor, a magnetic flux sensor and a magnetic field strength sensor, a temperature sensor, a heat flow sensor, a thermal conductivity sensor, a light modulator, an acoustic sensor, a gas sensor, a humidity sensor, an ion sensor, or a biosensor.

The logic control substrate 21 may be used to configure a control circuit, which may drive the operation of each die soldered on the interconnection dielectric layer 24 through the electrical interconnection structures in the interconnection dielectric layer 24. The semiconductor device layer 22 of the logic control substrate 21 may be formed by fabricating the central processing unit 23a and the logic controller 23b on a substrate wafer (not shown, i.e., a silicon wafer) by a semiconductor device fabrication process, that is, the central processing unit 23a and the logic controller 23b may be fabricated on the substrate wafer by a complementary metal-oxide-semiconductor (CMOS) process. Both the central processing unit 23a and the logic controller 23b may be CMOS circuit structures. The central processing unit 23a and the logic controller 23b may include a portion embedded inside the substrate wafer and a portion protruding from an upper surface of the substrate wafer, so the semiconductor device layer may include the central processing unit 23a, the logic controller 23b and the substrate wafer. The substrate wafer may be made of a substrate material including silicon, silicon-on-insulator (SOI) or glass, or any other substrate materials which are suitable for process requirements or easy to be processed or integrated by a semiconductor process. The substrate wafer may be further made of a semiconductor material including germanium, silicon germanium, silicon carbide, gallium arsenide, indium gallium, or other III, V compounds. The semiconductor device layer may further include certain materials for protecting the substrate wafer or dielectric materials forming a gate dielectric layer and/or a gate spacer. In the semiconductor device layer 22, isolation structures may be formed respectively for isolating any two adjacent MOS transistors in the central processing unit 23a, for isolating any two adjacent MOS transistors in the logic controller 23b, and for isolating the control processing unit 23a and the logic controller 23b. The logic controller 23b may be a logic interface (debug) module, a watchdog, or a timer. The logic interface module may be used to implement debug, test, or detection of the microcontroller unit. The logic interface module may be a joint test action group (JTAG) interface, a serial wire debug (SWD) interface or a serial presence detect (SPD) interface. The JTAG protocol is an international standard test protocol (IEEE 1149.1 compatible), which is mainly used for an internal chip test. The standard JTAG interface has 20 pins and is connected to 4 lines: TMS, TCK, TDI and TDO, which are mode select, clock, data input and data output respectively. The SPD interface is an 8-pin small outline integrated circuit (SOIC) package (3 mm×4 mm) 256-byte EEPROM module, which may record parameter information including speed, capacity, voltage and row/column address bandwidth of the memory chip, and the parameter information is an important indicator for identifying the memory chip. The watchdog is logic module specially used to monitor the run status of the microcontroller program. Since the operation of the microcontroller unit is often interfered by external electromagnetic fields, which may cause a fleet program to enter an infinite loop, and the normal operation of the program may be interrupted. The system controlled by the microcontroller unit may not continue to operate, the entire system may stagnate and have unpredictable consequences. Therefore, the "watchdog" may be created for real-time monitoring of the operation state of the microcontroller unit.

The interconnection dielectric layer 24 of the logic control substrate 21 may be formed by the back-end-of-line metal interconnection process. The interconnection dielectric layer 24 may cover the semiconductor device layer 22 and may be a single layer structure or a multiple layer structure. The interconnection dielectric layer 24 may be made of an insulation material which at least includes silicon oxide, silicon nitride, silicon carbide, silicon oxynitride, low-k dielectric (dielectric constant less than 3.9), or a combination thereof. The interconnection dielectric layer 24 may be used to implement the isolation between adjacent conductive contact plugs and adjacent metal interconnection wiring in the electrical interconnection structures. Electrical interconnection structures 25a, 25b, and 25c may be formed in the interconnection dielectric layer 24, and each electrical interconnection structure may include multiple layers of metal interconnection wiring (not shown) and conductive contact plugs (not shown) between two adjacent layers of metal interconnection wiring. The electrical interconnection structure 25a may be used to implement the electrical connection between the instruction set memory die 31 and the central processing unit 23a, and the electrical interconnection structure 25b may be used to implement the electrical connection between the logic controller 23b and the non-memory die 32. The central processing unit 23a may be the core of the microcontroller unit of one embodiment, and the logic controller 23b may control the non-memory die 32 under the required control of the central processing unit 23a. The electrical interconnection structure 25c in the interconnection dielectric layer 24 may be used to electrically connect to the logic controller 23b and the central processing unit 23a. Preferably, various required passive components including resistors, capacitors, inductors, and the like may be also formed in the interconnection dielectric layer 24, so the fabrication of the passive components may be compatible with the fabrication of each electrical interconnection structure to simplify the process and reduce the fabrication cost. In other embodiments of the present disclosure, the electrical interconnection structures formed in the interconnection dielectric layer 24 may all be conductive contact plugs. In one embodiment, a surface of the interconnection dielectric layer 24 away from the semiconductor device layer 22 may be used as a first surface (or referred to as a front surface) of the logic control substrate 21, and a surface of the semiconductor device layer 22 away from the interconnection dielectric layer 24 may be used as a second surface (or referred to as a back surface) of the logic control substrate 21. Portions of the electrical interconnection structures 25a and 25b exposed by the upper surface of the interconnection dielectric layer 24 may be used as solder joints for soldering the instruction set memory die 31 and the non-memory die 32.

Solder joints (not shown, or referred to as contact soldering pads, which may also be used to transfer signals between the die and the central processing unit or the logic controller) corresponding to the solder joints on the interconnection dielectric layer 24 may be disposed on the instruction set memory die 31 and the non-memory die 32, respectively. The solder joints of the instruction set memory die 31 and the non-memory die 32 and the solder joints on the interconnection dielectric layer 24 (i.e., portions of the electrical interconnection structures 25a and 25b exposed by the interconnection dielectric layer 24, such as a top of a conductive contact plug or a top of an interconnection wire) may be aligned with each other, and may be vertically soldered by an electroplating soldering process, thereby implementing the electrical connection between the instruction set memory die 31 and the central processing unit 23a, and the electrical connection between the non-memory die 32 and the logic controller 23b. In one embodiment, from the jointing orientation, the instruction set memory set 31 may be aligned with the central processing unit 23a, and the solder joint of the instruction set memory die 31 may be aligned with and be electrically connected to the electrical interconnection structure 25a directly above the central processing unit 23a in the interconnection dielectric layer 24, such that the instruction set memory die 31 may be vertically connected to the central processing unit 23a correspondingly, thereby implementing the instruction access by the central processing unit 23a from the instruction set memory die 31. Currently, an effective length of the electrical interconnection structure 25a for connecting the instruction set memory die 31 and the central processing unit 23a may be a perpendicular distance between the instruction set memory die 31 and the central processing unit 23a. Therefore, a shortest length of the electrical connection path between the instruction set memory die 31 and the central processing unit 23a may be implemented, thereby ensuring that the central processing unit 23a may access the reduced instructions from the instruction set memory die 31 and also further improving the access speed of the reduced instructions of the central processing unit 23a. The non-memory die 32 may be aligned with the logic controller 23b, and the solder joint of the non-memory die 32 may be aligned with and be electrically connected to the electrical interconnection structure 25b directly above the logic controller 23b in the interconnection dielectric layer 24, such that the non-memory die 32 may be vertically connected to the logic controller 23b correspondingly, thereby implementing the control of the non-memory die 32 by the logic controller 23b and a shortest length of the electrical connection path between the logic controller 23b and the non-memory die 32, which may be advantageous for improving the control speed of the non-memory die 32 by the logic controller 23b. It should be noted that the relative position of the instruction set memory die 31 and central processing unit 23a may not be defined to be a complete alignment. That is, the projection regions of the instruction set memory die 31 and the central processing unit 23a on the upper surface of the interconnection dielectric layer 24 may not be defined to that one projection region is completely included by another projection region. In other embodiments of the present disclosure, as long as the projections of the instruction set memory die 31 and the central processing unit 23a on the upper surface of the interconnection dielectric layer 24 may have an overlapped region, and the electrical interconnection structure 25a for electrically connecting the instruction set memory die 31 and the central processing unit 23a may be located in the overlapped region, the length of the electrical connection path between the instruction set memory die 31 and the central processing unit 23a may be shortened and the access speed of the reduced instructions of the central processing unit 23a may be improved for the existing technology.

In one embodiment, in order to enhance the support force of the logic control substrate 21 and prevent warpage thereof, the carrier 41 may be further bonded to the back surface of the logic control substrate 21 in the microcontroller unit. The carrier 41 may be any suitable carrier materials known to those skilled in the art, such as semiconductors, glass, ceramics, and the like. The carrier 41 and the second surface of the logic control substrate 21 may be bonded by any suitable bonding methods such as temporary bonding, attaching, and the like. The materials used for bonding may be, for example, a die attach film (DAF), a dry film or a photoresist, and the like.

Figure 3:
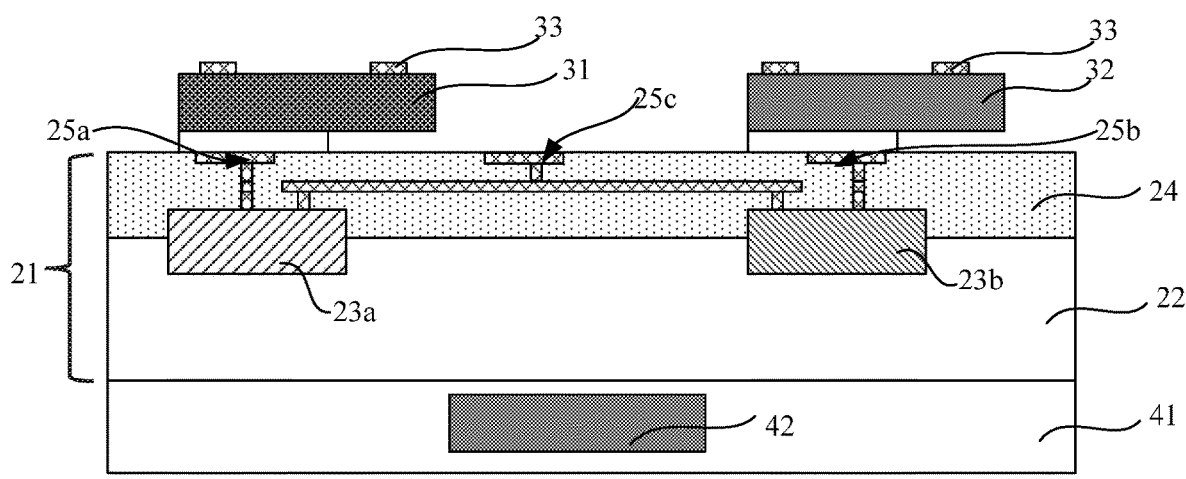
FIG. 3 illustrates a cross-sectional structural view of an MCU according to various embodiments of the present disclosure.
Figure 4:
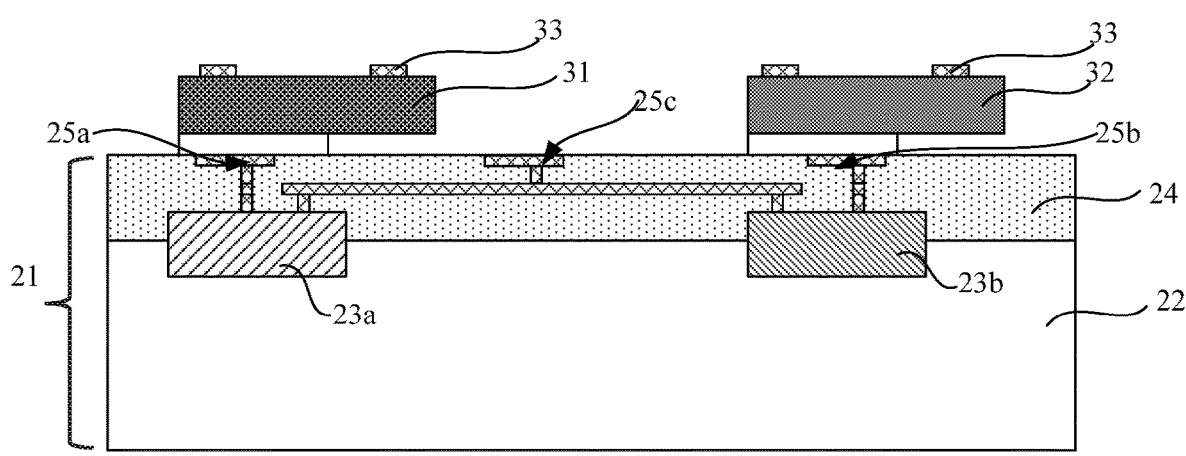
FIG. 4 illustrates a cross-sectional structural view of an MCU according to various embodiments of the present disclosure.

Referring to FIG. 3, in some embodiments of the present disclosure, in order to further utilize resources effectively and improve product integration, some back-in functional devices 42, such as back-in photosensor devices (for blood pressure measurement, and the like) and/or back-in image sensors (for collecting back images, including fingerprint sensors, and the like), may be formed in the carrier 41. It should be noted that, in some embodiments of the present disclosure, when the mechanical property of the logic control substrate 21 itself is sufficiently enough to support the instruction set memory die 31 and the non-memory die 32, the carrier 41 may be omitted, as shown in FIG. 4.

In the above-mentioned embodiments, the instruction set memory die 31 may only form the primary memory, and the non-memory die 32 may only have one piece, which may not be limited in the technical solutions of the present disclosure. In other embodiments of the present disclosure, a plurality (not less than 2) memory dies (including the instruction set memory dies) and a plurality (not less than 2) non-memory dies may be vertically soldered on the logic control substrate 21 to implement a multiple level storage architecture and be compatible with more functions.

Figure 5A:
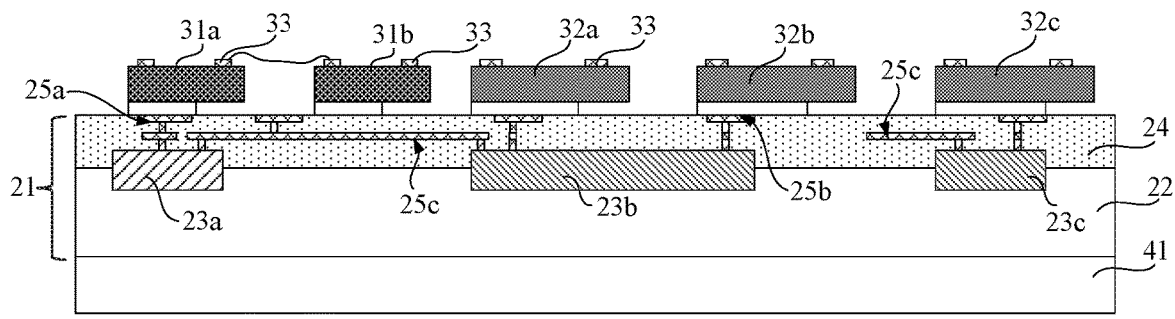
FIGS. 5A-5B illustrate cross-sectional structural views of exemplary MCUs according to various embodiments of the present disclosure.
Figure 5B:
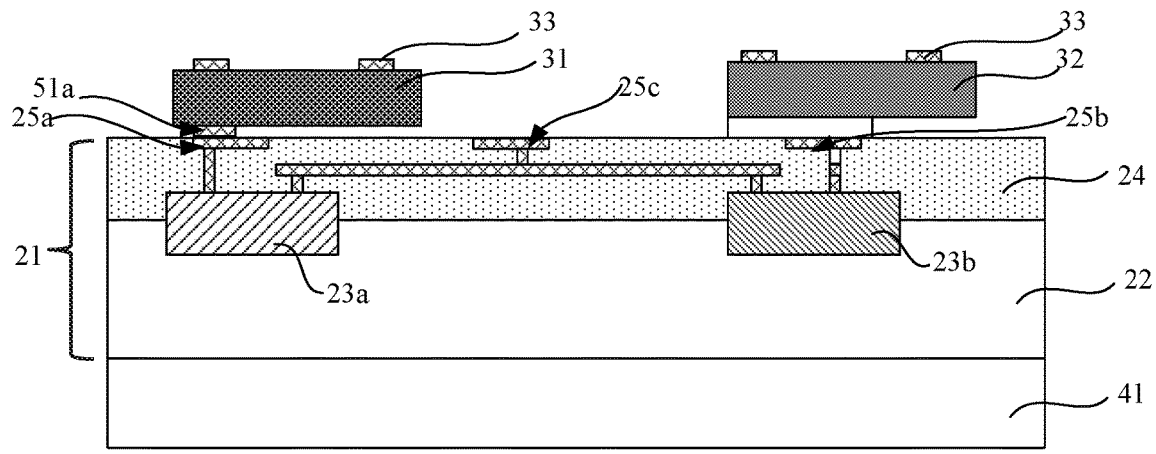

In one embodiment of the present disclosure, when the plurality of the memory dies 31a-31b shown in FIG. 5A, the plurality of the non-memory dies 32a-32c shown in FIG. 5A and the plurality of the logic controllers 23b-23c shown in FIG. 5A corresponding to non-memory dies are disposed in the microcontroller unit, all memory dies 31a-31b shown in FIG. 5A and all non-memory dies 32a-32c shown in FIG. 5A may be disposed side by side on the logic control substrate. That is, all memory dies 31a-31b shown in FIG. 5A and all non-memory dies 32a-32c shown in FIG. 5A may be laterally arranged on the logic control substrate. In addition, the all non-memory dies may include a primary memory die and memory dies lower than the primary level of the primary memory die. The primary memory die may be electrically connected to the corresponding the electrical interconnection structure in the interconnection dielectric layer 24 through soldering pads 51a shown in FIG. 5B, thereby electrically connecting to the central processing units 23a. The primary memory die may include the instruction set memory die 31a. The instruction set memory die may be vertically and directly soldered onto the interconnection dielectric layer and be closest to the central processing unit, which may be used for accessing instructions of the central processing unit 23a. Projections of the instruction set memory die and the central processing unit on the upper surface of the interconnection dielectric layer may have an overlapped region. The instruction set memory die and the central processing unit may be vertically and electrically connected to each other by the electrical interconnection structure in the interconnection dielectric layer of the overlapped region. The memory dies lower than the primary level may be electrically connected to the electrical interconnection structures (not shown) which are formed in the interconnection dielectric layer and electrically connected to the instruction set memory dies or the logic controllers by a vertical soldering process, thereby electrically connecting to the central processing unit indirectly; or the memory dies lower than the primary level may be sequentially and electrically connected to the instruction set memory dies or the corresponding logic controllers over the interconnection dielectric layer through leads (not shown, solder wires or redistribution structures) formed outside the interconnection dielectric layer, thereby electrically connecting to the central processing unit indirectly; or the memory dies lower than the primary level may be electrically connected to the electrical interconnection structures (not shown) which are formed in the interconnection dielectric layer and electrically connected to the central processing units by a vertical soldering process, thereby electrically connecting to the central processing unit directly to form a multiple level memory. Each non-memory die 32a-32c shown in FIG. 5A may be directly soldered to the interconnection dielectric layer and connected to the corresponding logic controller of the electrical interconnection structure in the interconnection dielectric layer to control the operation of the non-memory die, where the plurality of the non-memory dies may be simultaneously connected to one logic controller. Preferably, projections of the non-memory die and the corresponding logic controller on the upper surface of the interconnection dielectric layer may have an overlapped region. The non-memory die and the logic controller may be vertically and electrically connected to each other by the electrical interconnection structure in the interconnection dielectric layer of the overlapped region, thereby improving the control speed of the non-memory die by the logic controller. Preferably, all of the dies vertically soldered on the logic control substrate may have an optimized chip arrangement layout. In the chip arrangement layout, the remaining memory dies may be closer to the corresponding logic controller than the central processing unit, which may be advantageous for optimizing the distribution in the interconnection dielectric layer, improving the area utilization rate of the logic control substrate, and improving the data storage and read speed in the remaining memory dies directly by the logic controller. For example, referring to FIG. 5A, the microcontroller unit may have two memory dies (the instruction set memory die 31a and the secondary memory die 31b), three non-memory dies 32a, 32b, and 32c, one central processing unit 23a and two logic controllers 23b and 23c. The instruction set memory die 31a, the memory die lower than the primary level 31b, and non-memory dies 32a, 32b, and 32c may all be vertically soldered to the interconnection dielectric layer 24 side by side. The instruction set memory die 31a may be used as the primary memory die. The secondary memory die 31b may be electrically connected to the instruction set memory die 31a through a lead (may be a redistribution structure or a solder wire) formed outside of the interconnection dielectric layer 24, thereby electrically connecting to the central processing unit 23a indirectly. The instruction set memory die 31*a* may be closest to the central processing unit 23*a*. Projections of the instruction set memory die 31*a* and the central processing unit 23*a* on the upper surface of the interconnection dielectric layer 24 may have an overlapped region. The instruction set memory die 31*a* and the central processing unit 23*a* may be vertically and electrically connected to each other by the electrical interconnection structure 25*a* in the interconnection dielectric layer 24 of the overlapped region. Therefore, a two-level memory electrically connected to the central processing unit 23*a* may be formed, and the electrical connection path between the instruction set memory die 31*a* and the central processing unit 23*a* may be the shortest. The access speed of the instruction set memory die 31*a* may be faster than the access speed of the secondary memory die 31*b*, but the storage capacity of the instruction set memory die 31*a* may be smaller than the storage capacity of the secondary memory die 31*b*. The reduced instructions of the central processing unit 23*a* may be stored directly in the instruction set memory die 31*a*, and the remaining data and instructions may be transferred to the second memory die 31*b* for storage though the instruction set memory die 31*a*. Projections of the non-memory dies both 32*a* and 32*b* on the upper surface of the interconnection dielectric layer 24 may overlap the projection of the logic controller 23*b* on the upper surface of the interconnection dielectric layer 24. The non-memory dies 32*a* and 32*b* may be vertically and electrically connected to the logic controller 23*b* by the electrical interconnection structure 25*b* in the interconnection dielectric layer 24 of the overlapped region. Projections of the non-memory die 32*c* and logic controller 23*c* on the upper surface of the interconnection dielectric layer 24 may have an overlapped region. The non-memory die 32*c* may be vertically and electrically connected to the logic controller 23*c* through the electrical interconnection structure 25*c* in the interconnection dielectric layer 24 of the overlapped region.

Figure 6A:
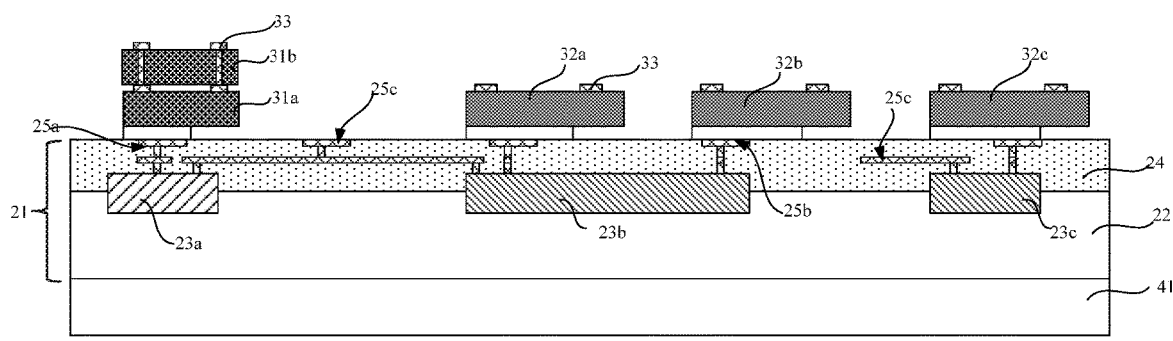
FIGS. 6A-6G illustrate cross-sectional structural views of exemplary MCUs according to various embodiments of the present disclosure.

In another embodiment of the present disclosure, when a plurality of memory dies 31*a*-31*b* shown in FIG. 6A, a plurality of non-memory dies 32*a*-32*c* shown in FIG. 6A, and a plurality of logic controllers corresponding to the non-memory dies 23*b*-23*c* shown in FIG. 6A are disposed in the microcontroller unit, all memory dies 31*a*-31*b* shown in FIG. 6A may be stacked one over another and soldered vertically to the logic control substrate through the memory die (i.e., the instruction set memory die) at a bottom level; and all non-memory dies 32*a*-32*c* shown in FIG. 6A may be soldered side by side on the logic control substrate, that is, all non-memory dies 32*a*-32*c* shown in FIG. 6A may be laterally arranged on the logic control substrate. Preferable, the memory die stack structure and all non-memory dies may have an optimal layout on the logic control substrate, which may be advantageous to optimize the distribution in the interconnection dielectric layer and improve the area utilization rate of the logic control substrate. In addition, in the stack structure of all memory dies, the memory die at the bottom level may be the instruction set memory die 31*a* shown in FIG. 6A, which may be directly soldered to the interconnection dielectric layer and be closest to the central processing unit for accessing instructions of the central processing unit. Projections of the instruction set memory die and the central processing unit on the upper surface of the interconnection dielectric layer may have an overlapped region. The instruction set memory die and the central processing unit may be vertically and electrically connected to each other by the electrical interconnection structure in the interconnection dielectric layer of the overlapped region. The instruction set memory die may be the primary memory of the microcontroller unit, and all remaining memory dies (e.g., memory die 31*b* shown in FIG. 6A) may be lower than the level of the instruction set memory die and be memory dies lower than the primary level. The memory dies lower than the primary level may be electrically connected to the instruction set memory die sequentially through leads (not shown, may be solder wires or redistribution structures), soldering pads or through-silicon via structures formed outside the interconnection dielectric layer, or may be electrically connected to the corresponding logic controllers through leads (not shown, may be solder wires or redistribution structures) formed outside the interconnection dielectric layer, thereby electrically connecting to the central process unit indirectly; or the memory dies lower than the primary level may be electrically connected to the corresponding electrical interconnection structures (not shown) electrically connecting to the central processing unit in the interconnection dielectric layer through leads (not shown, may be solder wires or redistribution structures) formed outside the interconnection dielectric layer, thereby electrically connecting to the central processing unit directly to form a multiple level memory. Each non-memory die 32*a*-32*c* shown in FIG. 6A may be directly soldered to the interconnection dielectric layer through the soldering pad and be electrically connected to the corresponding electrical interconnection structure in the interconnection dielectric layer, where the plurality of the non-memory dies may be simultaneously connected to one logic controller. Preferably, projections of the non-memory die and the corresponding logic controller on the upper surface of the interconnection dielectric layer may have an overlapped region. The non-memory die and the logic controller may be vertically and electrically connected to each other by the electrical interconnection structure in the interconnection dielectric layer of the overlapped region, thereby improving the control speed of the non-memory die by the logic controller. For example, referring to FIG. 6A, the microcontroller unit may have two memory dies (the instruction set memory die 31*a* and the secondary memory die 31*b*), three non-memory dies 32*a*, 32*b*, and 32*c*, one central processing unit 23*a* and two logic controllers 23*b* and 23*c*. The non-memory dies 32*a*, 32*b*, and 32*c* may be all vertically soldered to the interconnection dielectric layer 24 side by side. The instruction set memory die 31*a* may be used as the primary memory die. The secondary memory die 31*b* may be vertically stacked on the instruction set memory die 31*a* and be electrically connected to the instruction set memory die 31*a* through the through-silicon via structure (not shown), thereby electrically connecting to the central processing unit 23*a* indirectly. The instruction set memory die 31*a* may be closest to the central processing unit 23*a*. Projections of the instruction set memory die 31*a* and the central processing unit 23*a* on the upper surface of the interconnection dielectric layer 24 may have an overlapped region. The instruction set memory die 31*a* and the central processing unit 23*a* may be soldered to the electrical interconnection structure 25*a* in the interconnection dielectric layer 24 of the overlapped region through the soldering pad. Therefore, a two-level memory electrically connected to the central processing unit 23*a* may be formed, and the electrical connection path between the instruction set memory die 31*a* and the central processing unit 23*a* may be the shortest. The access speed of the instruction set memory die 31*a* may be extremely fast, and the storage capacity of the instruction set memory die 31*a* may be smaller than the storage capacity of the other memory die 31*b*. The reduced instructions of the central processing unit 23*a* may be stored directly in the instruction set memory die 31a, and the remaining data and instructions may be transferred to another memory die 31b for storage though the instruction set memory die 31a. Projections of the non-memory dies both 32a and 32b on the upper surface of the interconnection dielectric layer 24 may overlap the projection of the logic controller 23b on the upper surface of the interconnection dielectric layer 24. The non-memory dies 32a and 32b may be vertically and electrically connected to the logic controller 23b through the electrical interconnection structure 25b in the interconnection dielectric layer 24 of the overlapped region. Projections of the non-memory die 32c and logic controller 23c on the upper surface of the interconnection dielectric layer 24 may have an overlapped region. The non-memory die 32c may be vertically and electrically connected to the logic controller 23c through the electrical interconnection structure 25c in the interconnection dielectric layer 24 of the overlapped region.

In other embodiments of the present disclosure, when the plurality of the non-memory dies are disposed in the microcontroller unit, partial or all of the non-memory dies may further be vertically soldered to the interconnection dielectric layer of the logic control substrate by a vertical stack method, which is advantageous to further reduce the size of the integrated circuit device and improve integration.

It should be noted that, when each of the above-mentioned dies is disposed on the logic control substrate, in the case that it is not necessary to control the length of the electrical connection path between a die and a device connected to the die, any method implementing the electrical connection between the die and the corresponding die, the central processing unit or the logic controller may be applied to the present disclosure as long as the die layout may be optimized, the area of the logic control substrate may be properly utilized, and the required function and performance of the microcontroller unit may be achieved.

Figure 6B:
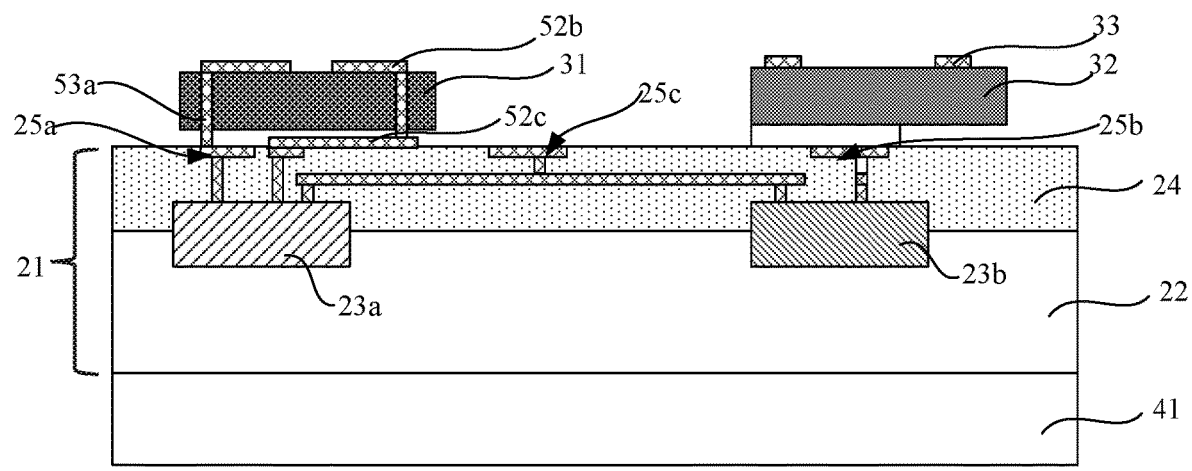
Figure 6C:
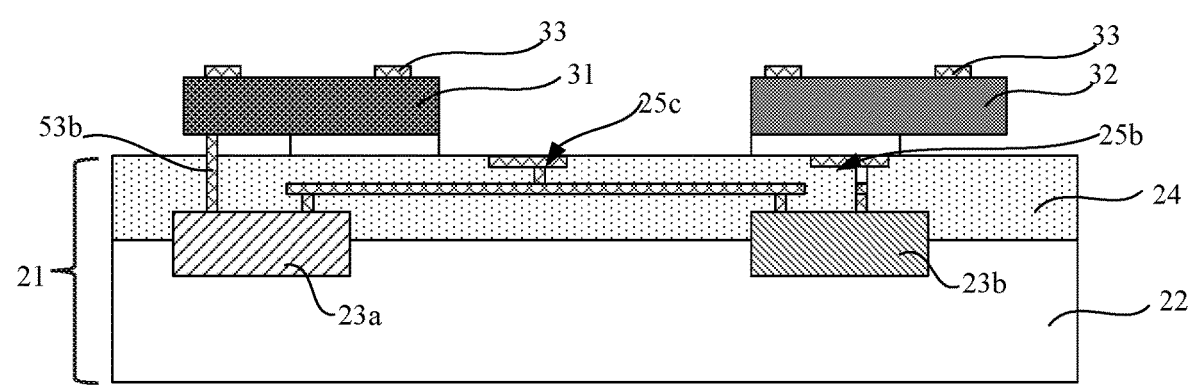
Figure 6D:
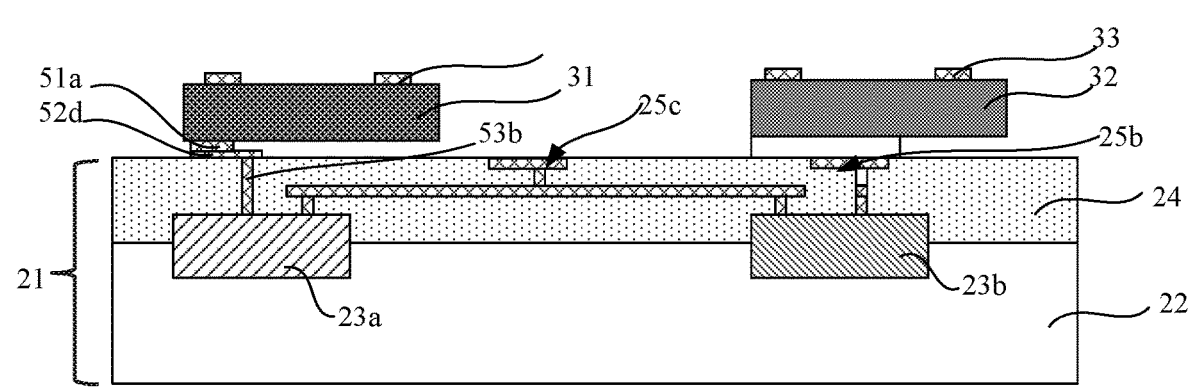
Figure 6E:
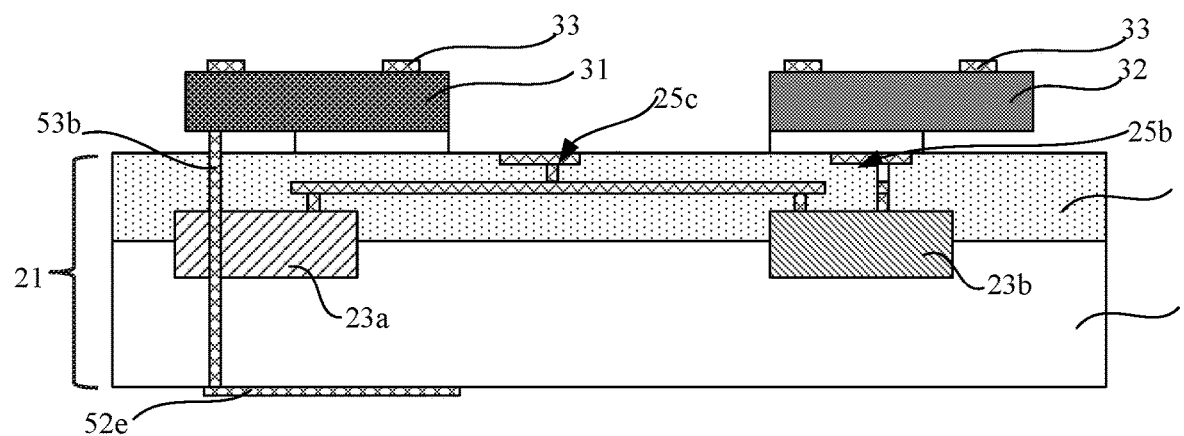
Figure 6F:
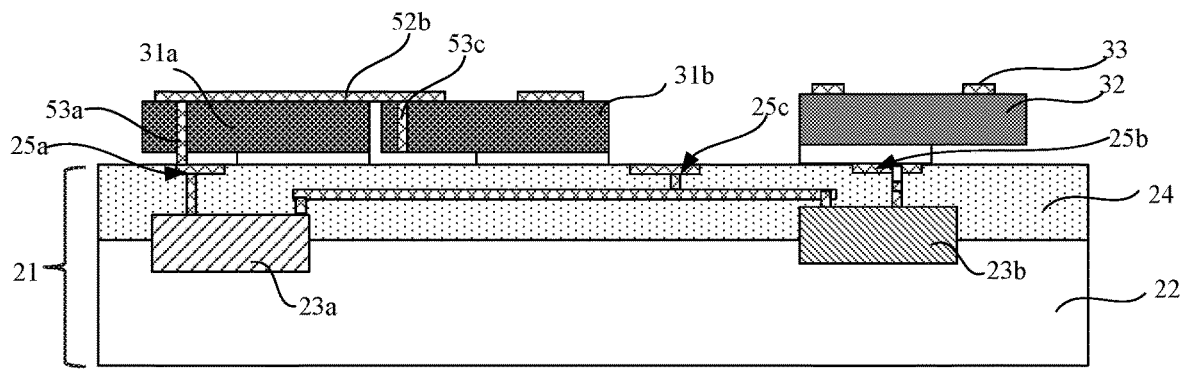
Figure 6G:
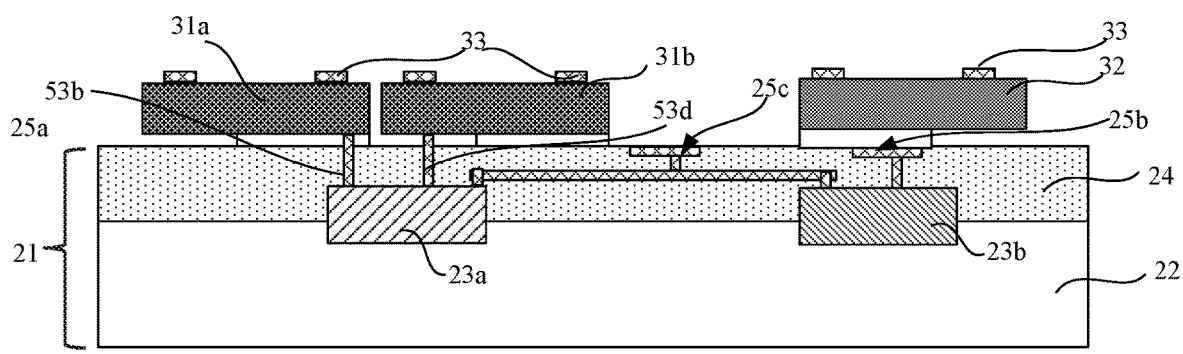

For example, in one embodiment of the present disclosure, the primary memory die may be bonded to the logic control substrate and a first plug 53a shown in FIG. 6B may be in the primary memory die. A first redistribution structure 52b shown in FIG. 6B electrically connected to the first plug may be formed on the upper surface of the primary memory die, and the first plug may be electrically connected to the central processing unit through the electrical interconnection structure in the interconnection dielectric layer; and/or, a second redistribution structure 52c shown in FIG. 6B may be formed on the lower surface of the primary memory die or in the interconnection dielectric layer. The second redistribution structure may be electrically connected to the first plug and may be electrically connected to the central processing unit through the electrical interconnection structure in the interconnection dielectric layer. In another embodiment of the present disclosure, the primary memory die may be bonded to the logic control substrate and the second plug 53b shown in FIG. 6C may be in the logic control substrate, and the second plug may be electrically connected to each of the primary memory die and the central processing unit; or the second plug 53b shown in FIG. 6D may be in the logic control substrate, and a third redistribution structure 52d shown in FIG. 6D electrically connected to the second plug may be formed on the upper surface of the logic control substrate, and the third redistribution structure may be electrically connected to each of the primary memory die and the central processing unit; and/or a fourth redistribution structure 52e shown in FIG. 6E electrically connected to the second plug may be formed on the lower surface of the logic control substrate, and the second plug may be electrically connected to each of the primary memory die and the central processing unit. In one embodiment of the present disclosure, when there are the memory dies lower than the primary level, and the memory dies lower than the primary level and the primary memory die are arranged side by side on the logic control substrate, the memory dies lower than the primary level may be connected to the logic control substrate in a same method as the primary memory die. For example, the primary memory die and the memory dies lower than the primary level may be bonded to the logic control substrate. The first plug 53a shown in FIG. 6F may be in the primary memory die and a third plug 53c shown in FIG. 6F may be in the memory dies lower than the primary level. The first redistribution structure 52b shown in FIG. 6F may be formed on the upper surfaces of the primary memory die and the memory dies lower than the primary level. The first distribution may be electrically connected to the first plug and the third plug. The first plug may be electrically connected to the central processing unit through the electrical interconnection structure in the interconnection dielectric layer. The third plug may be electrically connected to the central processing unit or the logic controller through the electrical interconnection structure in the interconnection dielectric layer or may be electrically connected to the primary memory die through the first redistribution structure and the first plug. And/or, the second redistribution structure may be formed on the lower surface of the primary memory die and the lower surfaces of the memory dies lower than the primary level, or the second redistribution structure may be formed on the interconnection dielectric layer. The second redistribution structure may be electrically connected to the first plug and the third plug. The primary memory die may be electrically connected to the electrical interconnection structure in the interconnection dielectric layer through the second redistribution structure, thereby electrically connecting to the central processing unit. The memory dies lower than the primary level may be electrically connected to the electrical interconnection structures in the interconnection dielectric layer through the second distribution, thereby electrically connecting to the central processing unit or the logic controller; or the memory dies lower than the primary level may be electrically connected to the primary memory die through the third plug, the second redistribution structure and the first plug. For another example, both the primary memory die and the memory dies lower than the primary level may be bonded to the logic control substrate; and the second plug 53b shown in FIG. 6G and a fourth plug 53d shown in FIG. 6G may be in the logic control substrate, where the second plug may be electrically connected to the primary memory die and the central processing unit, and the fourth plug may be electrically connected to the memory dies lower than the primary level and the central processing unit or be electrically connected to the primary memory die and the logic controller. Or, the second plug and the fourth plug may be in the logic control substrate, and the third redistribution structure (not shown), electrically connected to the second plug and the fourth plug, may be formed on the upper surface of the logic control substrate. The primary memory die may be electrically connected to the central processing unit through the third redistribution structure, the second plug, and the electrical interconnection structure in the interconnection dielectric layer. The memory dies lower than the primary level may be electrically connected to the central processing unit or the logic controller through the third redistribution structure, the fourth plug, and the electrical interconnection structures in the interconnection dielectric layer; or the memory dies lower than the primary level may be electrically connected to the primary memory die through the third redistribution structure, the fourth plug, and the second plug. And/or, the fourth distribution, electrically connected to the second plug and the fourth plug, may be formed on the lower surface of the logic control substrate. The primary memory die may be electrically connected to the central processing unit through the second plug and the fourth redistribution structure, and the memory dies lower than the primary level may be electrically connected to the central processing unit, the logic controller or the primary memory die through the fourth plug and the fourth redistribution structure.

In addition, it should be noted that the electrical connection method between the non-memory die and the logic controller may be the same as the electrical connection method between the memory die and the central processing unit, and the electrical connection method between two non-memory dies may be the same as the electrical connection method between two memory dies. Therefore, the electrical connection method between the non-memory die and the logic controller and the electrical connection method between two non-memory dies may be referred to the above-mentioned description of the electric connection method between the memory die and the central processing unit and the electrical connection method between two memory dies, which may not be described in detail herein.

In each of the above-mentioned embodiments, the primary memory dies may include a plurality of the instruction set memory dies, and may also include the memory dies (e.g., data memory dies) other than the instruction set memory dies. Each of the primary memory dies may be electrically connected to a corresponding electrical interconnection structure in the interconnection dielectric layer through a soldering pad, thereby connecting to the central processing unit, or each of the primary memory dies may be electrically connected to a corresponding electrical interconnection structure in the interconnection dielectric layer through the redistribution structure and a soldering pad, thereby connecting to the central processing unit. The memory dies lower than the primary level may not be limited to the secondary memory dies, but also include the tertiary memory dies, the quaternary memory dies, and the like. The number of the memory dies at each level may not be limited to one and may be two or more. When all memory dies are arranged side by side on the logic control substrate, the memory dies lower than the primary level may be electrically connected to the primary memory dies, thereby electrically connecting to the central processing unit through the primary memory dies; or the memory dies lower than the primary level may be electrically connected to the corresponding electrical interconnection structures in the interconnection dielectric layer, thereby electrically connecting to the central processing unit or the logic controller. When the memory dies lower than the primary level are stacked on the primary memory dies, the memory dies lower than the primary level may be electrically connected to the primary memory dies, and the primary memory dies may be electrically connected to the central processing unit.

The plurality of the memory dies in the above-mentioned embodiments may be same or different types, the plurality of the non-memory dies may also be dies with different types or purposes, and the plurality of the logic controllers may also have different control functions (e.g., a logic interface module, a watchdog or a timer), thereby improving the functionality of the microcontroller unit. The fabrication process of the plurality of the memory dies may be the same, similar or completely different, and the fabrication process of the plurality of the non-memory dies may be the same, similar or completely different. For example. when partial non-memory dies are MEMS dies, the fabrication process of the MEMS dies disclosed in the existing technology may be used to fabricate the MEMS device dies on different semiconductor substrates (e.g., a silicon wafer) respectively, where the MEMS devices may include a gyroscope, an accelerometer, an inertial sensor, a pressure sensor, a flow sensor, a displacement sensor, an electric field sensor, an electric field strength sensor, a current sensor, a magnetic flux sensor and a magnetic field strength sensor, a temperature sensor, a heat flow sensor, a thermal conductivity sensor, a light modulator, an acoustic sensor, a gas sensor, a humidity sensor, an ion sensor, or a biosensor; then the MEMS devices may be diced as individual dies as the MEMS device dies in one embodiment. Other non-memory dies may be various RF communication dies, analog to digital converter dies, digital to analog converter dies, and sensor dies fabricated by a process other than MEMS process. The RF communication dies may be, for example, near field communication (NFC) dies, Bluetooth dies, Wi-Fi dies, radio frequency identification chip (RFID) dies, and the like.

In addition, it should be noted that, when the microcontroller unit in one embodiment of the present disclosure has a plurality of memory dies, at least one of the primary memory dies may be used as the instruction set memory dies to store instructions of the central processing unit, where, compared to other primary memory dies and the memory dies lower than the primary level, the instruction set memory dies may be closest to the central processing unit; and the remaining memory dies other than the instruction set memory dies may be used as the data memory to store related data. Therefore, the separate storage of the instructions and data may be implemented, and the transmission buses of the instructions and data may be independent to each other, that is, the microcontroller unit in one embodiment may meet the access requirements of the MCU instructions and data of the Harvard architecture. In the microcontroller unit in another embodiment of the present disclosure, the instruction set memory dies or other primary memory dies may not only store instructions, but also store data, that is, the instructions and data of the microcontroller unit may be stored in a same memory space, and the instructions and data may share a same bus. That is, the microcontroller unit in one embodiment may meet the access requirements of the MCU instructions and data of the Princeton architecture.

Figure 7A:
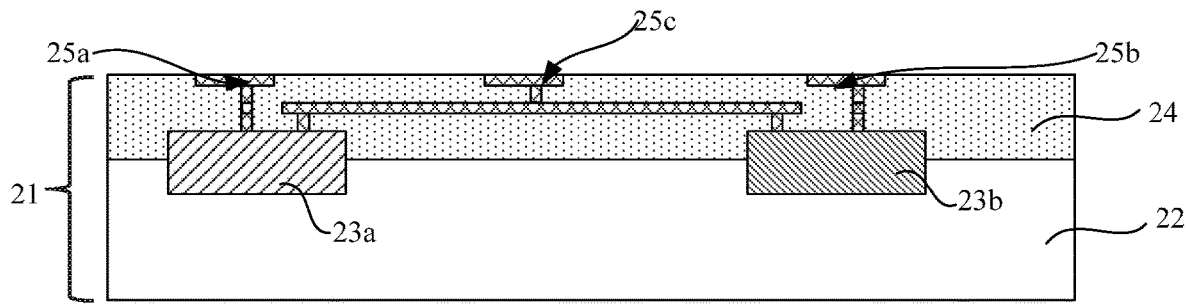
FIGS. 7A-7D illustrate a flow chart of a method for fabricating an MCU according to various embodiments of the present disclosure.
Figure 7B:
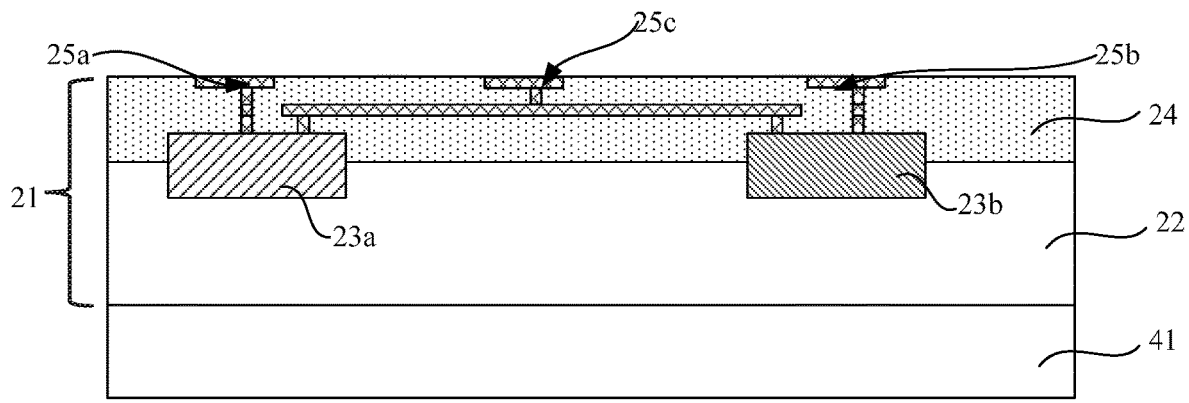
Figure 7C:
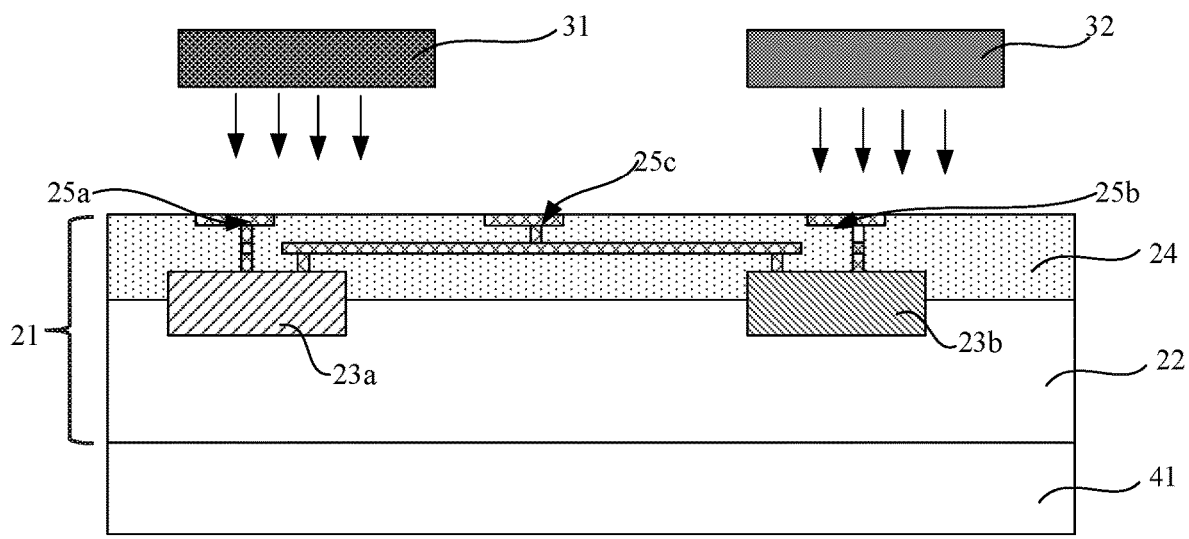
Figure 7D:
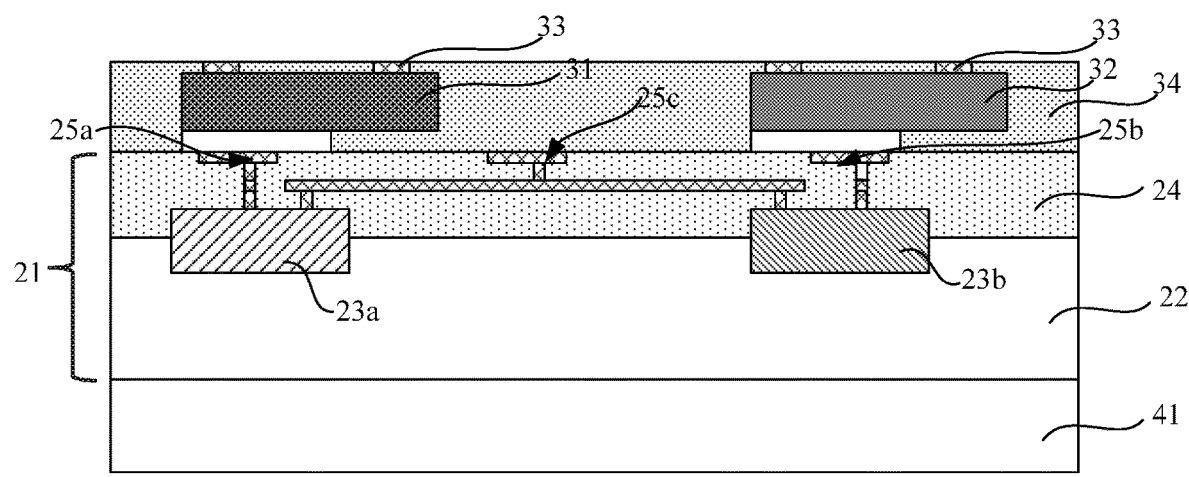

Referring to FIGS. 2-6, the microcontroller unit of each of the above-mentioned embodiments may further include an encapsulation layer 34 shown in FIG. 7D. The encapsulation layer may cover the logic control substrate 21, each of the memory dies and each of the non-memory dies, and be filled between two adjacent dies soldered on the logic control substrate 21, thereby protecting the logic control substrate, each of the memory dies and each of the non-memory dies from external damage, and fixing each of the memory dies and each of the non-memory dies more firmly on the logic control substrate 21. The encapsulation layer may include thermoplastic resins including polycarbonate, polyethylene terephthalate, polyether sulfone, polyphenylene ether, polyamide, polyetherimide, methacrylic resin or cyclic polyolefin resin, thermosetting resins including epoxy resin, phenol resin, polyurethane resin, acrylic resin, vinyl ester resin, imide resin, urethane resin, urea resin or melamine resin, or organic insulation materials including polystyrene, polyacrylonitrile, etc. The encapsulation layer may further include various additives (such as a curing agent, a modifier, a mold release agent, a thermochromic agent, a flame retardant, etc.) and/or a filler (for example, a silicon fine powder).

The microcontroller unit of each of the above-mentioned embodiments may further include a plurality of I/O soldering pads 33 at least having upper surfaces exposed by the encapsulation layer. A portion of the I/O soldering pads 33 may be formed on the upper surfaces of the memory dies to electrically connect to the memory dies, and another portion of the I/O soldering pads 33 may be formed on the upper surfaces of the non-memory dies to electrically connect to the non-memory dies. The I/O soldering pads 33 may be used to output signals of the corresponding dies or input required signals to the corresponding dies. It should be noted that, before each die is disposed on the logic control substrate 21, some soldering pads for soldering to the logic control substrate 21 may be formed in advance on the lower surface of each die, and the soldering pads may be used not only for soldering, but also for transferring input/output signals between the central processing unit or the logic controller and the die.

The present disclosure further provides a method for fabricating a microcontroller unit according to various embodiments of the present disclosure. The method includes:

S1, providing a logic control substrate, where the logic control substrate may include a semiconductor device layer and an interconnection dielectric layer stacked sequentially from bottom to top; forming a central processing unit and at least one logic controller in the semiconductor device layer; and forming electrical interconnection structures for respectively leading out the central processing unit and the logic controller in the interconnection dielectric layer;

S2, providing at least one memory die and at least one non-memory die having a non-storage function; disposing all memory dies on the interconnection dielectric layer side by side or stacked one over another; and disposing all non-memory dies on the interconnection dielectric layer side by side or stacked one over another;

S3, forming electrical connection structures, where the memory die and the non-memory die may be electrically connected to corresponding electrical interconnection structures respectively, such that at least one memory die is electrically connected to the central processing unit, and the non-memory die may be electrically connected to the logic controller simultaneously;

S4, forming an encapsulation layer, covering the logic control substrate, each of the memory dies and each of the non-memory dies; and S5, forming a plurality of I/O soldering pads at least having upper surfaces exposed by the encapsulation layer, where a portion of the I/O soldering pads may be formed on the upper surfaces of the memory dies to electrically connect to the memory dies, and another portion of the I/O soldering pads may be formed on the upper surfaces of the non-memory dies to electrically connect to the non-memory dies.

Referring to FIG. 7A and FIG. 7B, providing the logic control substrate in step S1 may include the following steps.

First, a substrate wafer (not shown) may be provided, and the central processing unit 23*a* and at least one logic controller 23*b* may be formed on the substrate wafer, thereby forming the semiconductor device layer 22 including the central processing unit 23*a*, the logic controller 23*b* and the substrate wafer. In one embodiment, the substrate wafer may be a silicon substrate, a silicon-on-insulator (SOI) substrate or a glass substrate, or a substrate of any suitable semiconductor materials including germanium, silicon germanium, silicon carbide, gallium arsenide, indium gallium, other III, V compounds and the like. The central processing unit 23*a* corresponding to a subsequent memory die to be soldered and at least one logic controller 23*b* corresponding to a subsequent non-memory die to be soldered may be formed on the substrate wafer by a CMOS process. An isolation structure (not shown) may be disposed in the substrate wafer to isolate the central processing unit 23*a* and the logic controller 23*b* and to isolate adjacent logic controllers 23*b*. The isolation structure may be, for example, a shallow trench isolation (STI) structure and/or a deep trench isolation (DTI) structure. The central processing unit 23*a* and the logic controller 23*b* may be formed by a CMOS process, so the significance for forming the central processing unit 23*a* and each logic controller 23*b* on the substrate wafer may be: the structures of the central processing unit 23*a* and each logic controller 23*b* may include a portion embedded below the upper surface of the substrate wafer and also a portion protruding from the upper surface of the substrate wafer; or the structures of the central processing unit 23*a* and each logic controller 23*b* may only include the portion embedded below the upper surface of the substrate wafer; or the structures of the central processing unit 23*a* and each logic controller 23*b* may only include the portion protruding from the upper surface of the substrate wafer. The central processing unit 23*a* and each logic controller 23*b* may be laterally arranged on the substrate wafer, where "laterally" refers to the direction perpendicular to the thickness direction of the substrate wafer, and "laterally arranged" refers to that the arrangement is extended in the plate plane of the substrate wafer. The semiconductor device layer 22 may include the substrate wafer, the central processing unit, the logic controller and the device isolation structure.

Next, using a back-end-of-line metal interconnection process of the integrated circuit device fabrication, the semiconductor device layer 22 may be covered by the interconnection dielectric layer 24; and the electrical interconnection structure 25*a* for implementing the electrical connection between the central processing unit 23*a* and the subsequent memory die, the electrical interconnection structure 25*b* for implementing the electrical connection between the logic controller 23*b* and the subsequent non-memory die, and the electrical interconnection structure 25*c* for implementing the electrical connection between the logic controller 23*b* and the central processing unit 23*a* may be formed in the interconnection dielectric layer. Each electrical interconnection structure may include multiple layers of metal interconnection wiring (not shown) and conductive contact plugs (not shown) between two adjacent layers of metal interconnection wiring. The interconnection dielectric layer 24 may be used to implement isolations between adjacent conductive contact plugs and between adjacent metal interconnection wiring in the electrical interconnection structure. The interconnection dielectric layer 24 may be a single layer structure or a multiple layer structure. The interconnection dielectric layer 24 may be made of an insulation material which at least includes silicon oxide, silicon nitride, silicon carbide, silicon oxynitride, low-k dielectric (dielectric constant less than 3.9), or a combination thereof. The materials of the electrical interconnection structures 25*a*-25*c* may include a metal or an alloy of elements including cobalt, molybdenum, aluminum, copper, tungsten, and the like, and also include metal silicide (e.g., titanium silicide, tungsten silicide, cobalt silicide, and the like), metal nitride (e.g., titanium nitride) or doped polysilicon and the like. Preferably, various passive components including resistors, capacitors, inductors, and the like may be also formed in the interconnection dielectric layer 24, so the fabrication of the required passive components may be compatible with the fabrication of each electrical interconnection structure to simplify the process and reduce the fabrication cost. The interconnection dielectric layer 24 and the semiconductor device layer 22 may be stacked and combined into the logic control substrate 21, where the upper surface of the interconnection dielectric layer 24 may be the first surface (i.e., the upper surface or the front surface) of the logic control substrate 21, and the lower surface (i.e., the back surface) of the semiconductor device layer 22 may be the second surface of the logic control substrate 21 (i.e., the lower surface or the back surface). The arrangement of the wiring and/or the conductive contact plugs in the interconnection dielectric layer 24 may be configured according to the layout of all dies to be soldered on the logic control substrate 21 subsequently and the solder joint position of each die. When the layout of all dies to be soldered on the logic control substrate 21 subsequently adopts a preferred chip layout, the wiring layout in the interconnection dielectric layer 24 may also implement a preferred design.

Next, the logic control substrate 21 may be thinned from the lower surface (i.e., the back surface) of the semiconductor device layer 22. For example, the semiconductor device layer 22 may be thinned by a back-grinding process, a wet etch process, a hydrogen ion implantation process and the like. Thinning the logic control substrate 21 may be advantageous to reduce the overall thickness of the microcontroller unit to be formed.

Next, the carrier 41 may be provided, and the second surface of the logic control substrate 21 (i.e., the lower surface of the semiconductor device layer 22) may be bonded to the carrier 41 by a wafer-level packaging (WLP) process. Currently, the logic control substrate 21 and the carrier 41 may be physically connected together. The carrier 41 may be any suitable carrier materials known to those skilled in the art, such as semiconductors, glass, ceramics, and the like. The carrier 41 and the second surface of the logic control substrate 21 may be bonded through any suitable bonding methods such as temporary bonding, attaching, and the like. For example, fusion bonding, particularly a low temperature fusion bonding process, may be used to avoid excessive temperature in the bonding process, resulting in failure of each component in the logic control substrate 21, where the temperature of the low temperature fusion bonding process may be less than 400° C. For example, the temperature of the low temperature fusion bonding process may be between 100° C. and 250° C. For another example, the carrier 41 and the second surface of the logic control substrate 21 may be bonded together by an attaching process, and the bonding layer (not shown) for bonding the carrier 41 and the logic control substrate 21 may be any one of various organic thin films formed by an ultraviolet-denatured organic material, such as a die attach film (DAF), a dry film or a photoresist, and the like. The thickness of the bonding layer may be configured as required. The number of the layers of the bonding layer may not be limited to one layer but may be two or more layers. Optionally, before or after loading the logic control substrate 21 onto the carrier 41, back-in functional devices (shown in FIG. 3) may be formed in the carrier 41 to meet special requirements. The back-in functional devices may be, for example, back-in photosensor devices (for blood pressure measurement, and the like) and/or back-in CMOS image sensors (for collecting images, including fingerprint, and the like). Currently, the carrier 41 and the logic control substrate 21 may need not only physical connection, but also electrical connection implementation. For example, the electrical connection between the logic controller, and the like in the logic control substrate 21 and the back-in functional device 42 in the carrier 41 may be implemented from the back side of the carrier 41 (i.e., a side of the carrier facing away from the interconnection dielectric layer 24) through electrical connection techniques (i.e., a through-silicon via process and an electroplating process) known to those skilled in the art, which may not be described in detail herein because it is not the focus of the present disclosure.

It should be noted that, in some embodiments of the present disclosure, when the mechanical property of the logic control substrate 21 itself is sufficiently enough to support the packaging of the instruction set memory die 31 and the non-memory die 32, the loading of the carrier 41 may be omitted, as shown in FIG. 4.

It should be noted that, on the one hand, only the logic control circuits including the central processing unit 23a and the electrical interconnection structures for implementing the electrical connection between the subsequent package die and the corresponding logic control circuit may be required to be fabricated in the logic control substrate 21, so the fabrication process of each memory die and each non-memory die through processes including film deposition, etching, and the like on the semiconductor device layer 22 may be omitted, thereby greatly reducing the number of layers of the logic control substrate 21 obtained in step S1, greatly reducing the number of masks for fabricating the logic control substrate 21, and reducing the plate making cost and process cost. On the other hand, all logic controllers and the central processing unit 23a may be laterally arranged in the logic control substrate 21, and the electrical interconnection structures used by the dies which are subsequently and vertically soldered on the logic control substrate 21 may be formed on all logic controllers and the central processing unit, that is, each electrical interconnection structure formed in the interconnection dielectric layer 24 above the logic controller and the central processing unit 23a may be reliable and effective, thereby avoiding waste in the existing technology due to the fabrication of the dummy structure.

Referring to FIG. 7C and FIG. 7D, in step S2, at least one memory die (31 shown in FIG. 7C and FIG. 7D) and at least one non-memory die (32 in FIG. 7C and FIG. 7D) may be first provided by purchasing or wafer processing, and all of the memory dies (31 shown in FIG. 7C and FIG. 7D) and the non-memory dies (32 shown in FIG. 7C and FIG. 7D) may be disposed side by side on the interconnection dielectric layer 24, which may be only arranged on the interconnection dielectric layer 24 or may also be attached on the interconnection dielectric layer 24 by an adhesive. Next, in step S3, the memory dies and non-memory dies may be vertically soldered to corresponding positions of the first surface (i.e., the upper surface of the interconnection dielectric layer 24) of the logic control substrate 21 by an electroplating process to form the electrical connection structures electrically connecting the dies and the electrical interconnection structures in the interconnection dielectric layer 24, thereby making at least one memory die to be electrically connected to the central processing unit (23a shown in FIG. 7C and FIG. 7D), and making the non-memory dies (32 shown in FIG. 7C and FIG. 7D) to be electrically connected to the logic controller (23b shown in FIG. 7C and FIG. 7D).

In some embodiments of the present disclosure, all memory dies may first be stacked one over another, and then the bottommost memory die (i.e., the instruction set memory die) may be vertically soldered on the interconnection dielectric layer 24 and the upper memory dies may all be connected to the bottommost memory die, so all memory dies may be electrically connected to the central processing unit 23a through the electrical interconnection structures in the interconnection dielectric layer 24. Partial or all non-memory dies (32 shown in FIG. 7C and FIG. 7D) may first be vertically stacked one over another, and then the bottommost non-memory die may be vertically soldered on the interconnection dielectric layer 24 and the upper non-memory dies may all be connected to the bottommost non-memory die, so the non-memory dies stacked vertically one over another may be electrically connected to the corresponding logic controller (23b shown in FIG. 7C and FIG. 7D) through the corresponding electrical interconnection structures in the interconnection dielectric layer.

The specific principle of directly soldering any one of the dies on the interconnection dielectric layer 24 of the logic control substrate 21 in step S3 may be the following. Exposed solder joins (i.e., a portion of the top surface of the interconnection structure in the interconnection dielectric layer 24) for soldering the die may be on the surface of the interconnection dielectric layer 24 of the logic control substrate 21, and the die may be used to be soldered on the exposed solder joins (i.e., soldering pads, bonding pads, or pads) on the surface of the logic control substrate 21; the die may be physically connected to a suitable position on the surface of the interconnection dielectric layer 24 by an adhesive or the like, so the solder join on the surface of the interconnection dielectric layer 24 and the solder join of the die may be aligned with each other, and a cavity exposing the soldering surface of the two solder joins may be formed between the two solder joins; next, the cavity may be filled with a conductive metal (i.e., copper, nickel, zinc, tin, silver, gold, tungsten, magnesium, and the like) by an electroplating process to electrically connect to the solder join of the die and the solder join on the surface of the interconnection dielectric layer 24, so the die may be electrically connected to the central processing unit 23a or the logic controller 23b through the corresponding electrical interconnection structure in the interconnection dielectric layer 24.

Furthermore, in all memory dies disposed on the logic control substrate 21, one of the memory dies, referred to as the instruction set memory die (31 shown in FIG. 7C and FIG. 7D), may be vertically soldered on the interconnection dielectric layer 24 directly and be closest to the central processing unit 23a for accessing instructions of the central processing unit 23a. Projections of the instruction set memory die (31 shown in FIG. 7C and FIG. 7D) and the central processing unit 23a on the upper surface of the interconnection dielectric layer 24 may have an overlapped region. The instruction set memory die (31 shown in FIG. 7C and FIG. 7D) and the central processing unit 23a may be vertically and electrically connected to each other by the electrical interconnection structure 25a in the interconnection dielectric layer 24 of the overlapped region. The vertical soldering packaging method of the instruction set memory die and the logic control substrate 21 may be advantageous to shorten the length of the metal lead for electrically connecting the instruction set memory die and the central processing unit 23a; the metal lead may be shortened to a vertical lead which is in the interconnection dielectric layer 24 of the overlapped region and has a same thickness as the interconnection dielectric layer 24 (i.e., the height of the electrical interconnection structure 25a in FIG. 7C and FIG. 7D), so the microcontroller of the present disclosure may meet the requirements of the reduced instruction signal transmission in the RISC architecture, and further improve the access speed of the reduced instructions. When the plurality of memory dies and the plurality of non-memory dies are provided in the step, the arrangement of the dies on the logic control substrate 21 may be referred to FIG. 5A and FIG. 6A, and specific details may be referred to the above-mentioned descriptions of the embodiments shown in FIG. 5A and FIG. 6A, which may not be described in detail here. When the microcontroller unit to be formed has the plurality of memory dies, the plurality of non-memory dies and the plurality of logic controllers corresponding to the non-memory dies, the plurality of the memory dies may be same or different types, the plurality of the non-memory dies may also be dies with different types or purposes, and the plurality of the logic controllers may also have different control functions (e.g., a logic interface module, a watchdog or a timer), thereby improving the functionality of the microcontroller unit. The memory die used as the instruction set memory die may be an SRAM die, a DRAM die, a flash die, an EEPROM die, a SD memory die, or an MMC memory die. The plurality of non-memory dies may include a base portion other than the logic control portion of a conventional microcontroller implemented by dies. The non-memory dies may also be dies which are functionally extended relative to the base portion of the MCU. That is, the plurality of non-memory dies may include a radio frequency communication die and/or an analog to digital converter die as the base portion of the MCU, and various MEMS sensor dies or sensor dies fabricated by a process other than the MEMS process as the extension portion. The radio frequency communication die may be, for example, a near field communication (NFC) die, a Bluetooth die, a Wi-Fi die, a radio frequency identification chip (RFID) die, and the like. The MEMS sensor die may be, for example, a gyroscope, an accelerometer, an inertial sensor, a pressure sensor, a flow sensor, a displacement sensor, an electric field sensor, an electric field strength sensor, a current sensor, a magnetic flux sensor and a magnetic field strength sensor, a temperature sensor, a heat flow sensor, a thermal conductivity sensor, a light modulator, an acoustic sensor, a gas sensor, a humidity sensor, an ion sensor, or a biosensor.

Referring to FIG. 7D, in step S4, an encapsulation layer 34 may cover the first surface of the logic control substrate 21, each memory die and each non-memory die by an injection molding process. The encapsulation layer 34 may not only encapsulate each memory die and each non-memory die, but also be filled in gaps between each die and the interconnection dielectric layer 24 and gaps between adjacent dies, and may also provide a flat upper surface, so the process surface required for the subsequent I/O soldering pad fabrication process may be provided, and the sealing of the microcontroller unit may be implemented, thereby better isolating air and moisture and improving packaging effect. For example, the encapsulation layer 34 may include a thermosetting resin, which may soften or flow during the molding process, have plasticity, and may be fabricated into a certain shape and have chemical reactions to form cross-linking solidification. The encapsulation layer 34 may include at least one of thermosetting resins such as a phenol resin, a urea resin, a melamine-formaldehyde resin, an epoxy resin, an unsaturated resin, a polyurethane, and a polyimide. The epoxy resin is preferably used as the encapsulation layer 34, where the epoxy resin may be an epoxy resin having a filler material or a filler-free material, and may further include various additives (i.e., a curing agent, a modifier, and a mold release). For example. a phenolic resin may be used as a curing agent, and a solid particle (i.e., a silicon fine powder) or the like may be used as a filler. In other embodiments of the present disclosure, the encapsulation layer 34 may be formed by a coating process, a chemical vapor deposition process, and the like.

Referring to FIG. 7D, in step S5, the I/O soldering pads 33 may be formed on the encapsulation layer 34 by a electroplating process or a redistribution process, and may include a portion embedded in the encapsulation layer 34, where when each soldering pad 33 is formed by the electroplating process, each soldering pad 33 may be extended from the upper surface of the encapsulation layer 34 to the upper surface of a corresponding memory die or a corresponding non-memory die, thereby leading out the memory die or the non-memory die. The fabrication process of the I/O soldering pads 33 may be a fabrication process known to those skilled in the art, which may not be described in detail herein.

Furthermore, it should be noted that one fabrication method of the input and output soldering pads required by the central processing unit 23a and each logic controller may be: in the case that the internal space of the interconnection dielectric layer 24 and the upper surface area of the interconnection dielectric layer 24 are allowed, the input and output soldering pads required by the central processing unit 23a and the each logic controller may be formed in the encapsulation layer 34 above the upper surface of the interconnection dielectric layer 24 when the I/O soldering pads 33 are fabricated, where the input and put soldering pads may be electrically connected to the electrical interconnection structures, which are electrically connected to the central processing unit 23a and each logic controller, in the interconnection layer. Another fabrication method of the input and output soldering pads may be: in the case that the internal space of the interconnection dielectric layer 24 and the upper surface area of the interconnection dielectric layer 24 are not allowed, the input and output soldering pads required by the central processing unit 23a and each logic controller may be fabricated on the back side of the carrier 41.

It should be noted that, in step S3 of the above-mentioned embodiments, each die may be disposed on the logic control substrate by the vertical soldering method, and the purpose may be to shorten the electrical connection path between the die and the central processing unit or the logic controller. Obviously, in the case that it is not necessary to control the length of the electrical connection path between a die and a device connected to the die, any method implementing an electrical connection between the die and the corresponding die or the central processing unit or the logic controller may be applied to step S3 of the present disclosure as long as the die layout may be optimized, the area of the logic control substrate may be properly utilized, and the required function and performance of the microcontroller unit may be achieved. For example, in one embodiment, the redistribution structure electrically connected to the corresponding electrical interconnection structure in the interconnection dielectric layer may be first formed on the interconnection dielectric layer, and then the redistribution structure and the corresponding die soldering pad may be soldered together to form the electrical connection structure. In one embodiment of the present disclosure, the corresponding die may be first bonded to the interconnection dielectric layer, and then a plug may be formed in the die and the first redistribution structure electrically connected to the plug may be formed on the upper surface of the primary memory die, where the plug may be electrically connected to the central processing unit or the logic controller through the electrical interconnection structure in the interconnection dielectric layer; and/or, before the corresponding die is bonded to the interconnection dielectric layer, the second redistribution structure may be first formed on the lower surface of the die or in the interconnection dielectric layer, and then a plug may be formed in the die and be electrically connected to the second redistribution structure, where the second redistribution structure may be electrically connected to the central processing unit or the logic controller through the electrical interconnection structure in the interconnection dielectric layer. In one embodiment of the present disclosure, before the corresponding die is bonded to the interconnection dielectric layer, a plug may be first formed in the logic control substrate; and after the corresponding die is bonded to the interconnection dielectric layer, the plug in the logic control substrate may be electrically connected to the die and the central processing unit or may be electrically connected to the die and the logic controller. In one embodiment of the present disclosure, before the corresponding die is bonded to the interconnection dielectric layer, a plug may be first formed in the logic control substrate, and then the third redistribution structure electrically connected to the plug of the logic control substrate may be formed on the upper surface of the logic control substrate, where the third distribution may be electrically connected to the die and the central processing unit or may be electrically connected to the die and the logic controller; and/or, the fourth redistribution structure may be then formed on the lower surface of the logic control substrate, the fourth redistribution structure may be electrically connected to the plug of the logic control substrate, where the plug of the logic control substrate may be electrically connected to the die and the central processing unit or may be electrically connected to the die and the logic controller. For the details of how the die in each embodiment is electrically connected to the central processing unit, the logic controller or another die, reference may be made to the description of the above-mentioned microcontroller structure section, and details may not be described herein. Moreover, preferably, the electrical connection structure between the non-memory die and the logic controller and the electrical connection structure between the memory die and the central processing unit may be fabricated in a same process, which may simplify process and save cost.

It should be noted that, in the embodiments of the present disclosure, the primary memory dies may not be limited to only one instruction set memory die and further include a plurality of the instruction set memory dies, and may also include the memory dies (e.g., data memory dies) other than the instruction set memory die. Each of the primary memory dies may be electrically connected to the corresponding electrical interconnection structure in the interconnection dielectric layer through the soldering pad, thereby connecting to the central processing unit; or each of the primary memory dies may be electrically connected to a corresponding electrical interconnection structure in the interconnection dielectric layer through the redistribution structure and the soldering pad, thereby connecting to the central processing unit. The memory dies lower than the primary level may not be limited to the secondary memory dies, but also include the tertiary memory dies, the quaternary memory dies, and the like. The number of the memory dies at each level may not be limited to one and may be two or more. When all memory dies are arranged side by side on the logic control substrate, the memory dies lower than the primary level may be electrically connected to the primary memory die, thereby electrically connecting to the central processing unit through the primary memory die directly; or the memory dies lower than the primary level may be electrically connected to the corresponding electrical interconnection structures in the interconnection dielectric layer, thereby electrically connecting to the central processing unit or the logic controller. When the memory dies lower than the primary level are stacked on the primary memory die, the memory dies lower than the primary level may be electrically connected to the primary memory die, and the primary memory die may be electrically connected to the central processing unit.

From the above-mentioned embodiments, it can be seen that the technical solutions provided by the present disclosure may achieve at least the following beneficial effects.

For the microcontroller fabrication method of the present disclosure, the semiconductor device layer having the logic control portion may be formed first, and the logic portion may include the central processing unit having core control functions and at least one logic controller which may have control functions different from the central processing unit; next, the interconnection dielectric layer having the electrical interconnection structure may be formed on the semiconductor device layer; then, at least one memory die and at least one non-memory die may be disposed on the corresponding positions of the interconnection dielectric layer, and may be further encapsulated and packaged. It is not necessary to directly fabricate the memory and various functional devices having non-storage functions in the semiconductor device layer, so the layouts required in the fabrication process of the integrated circuit devices may be reduced, and fabricating the dummy structures in the stacked layers on the logic portion in the existing device fabrication process which may be compatible with the memory and logic portion, which may effectively reduce the plate making cost and the overall fabrication cost. Furthermore, the instruction set memory die and the logic control substrate may be connected by the vertical soldering, projections of the instruction set memory die and the central processing unit on the upper surface of the interconnection dielectric layer may have the overlapped region, and the instruction set memory die and the central processing unit may be electrically connected to each other by the electrical interconnection structure in the interconnection dielectric layer of the overlapped region, which may be advantageous to shorten the length of the metal lead for electrically connecting the instruction set memory die and the central processing unit. The metal lead may be shortened to the vertical lead which is in the interconnection dielectric layer of the overlapped region and has a same thickness as the interconnection dielectric layer. That is, the instruction set memory die and the central processing unit may be vertically and electrically connected, so the microcontroller of the present disclosure may meet the requirements of the instruction signal transmission in the RISC architecture, and further improve the access speed of the reduced instructions. Moreover, the microcontroller unit and its fabrication method of the present disclosure may not only meet the requirements of the MCU instructions and data storage of the Harvard architecture, but also meet the requirements of the MCU instructions and data storage of the Princeton architecture.

It is apparent to those skilled in the art that various modifications and variations may be made in the disclosure without departing from the spirit and scope of the disclosure. Thus, if such modifications and variations of the present disclosure fall within the scope of the appended claims, the disclosure is also intended to cover such modifications and variations.

What is claimed is:
1. A microcontroller unit, comprising:
   a logic control substrate, including a semiconductor device layer and an interconnection dielectric layer formed on the semiconductor device layer, wherein:
     a central processing unit and at least one logic controller are formed in the semiconductor device layer, and electrical interconnection structures are formed in the interconnection dielectric layer for respectively leading out the central processing unit and the at least one logic controller; and
   at least one memory die and at least one non-memory die having a non-storage function, wherein:
     all of the at least one memory die are disposed on the interconnection dielectric layer side by side or stacked one over another, and the at least one memory die is connected to a corresponding electrical interconnection structure in the interconnection dielectric layer to electrically connect to the central processing unit; and
     all of the at least one non-memory die are disposed on the interconnection dielectric layer side by side or stacked one over another, and are electrically connected to corresponding electrical interconnection structures in the interconnection dielectric layer to electrically connect to corresponding logic controllers.

2. The microcontroller unit according to claim 1, wherein:
the at least one memory die at least includes a primary memory die; and/or
the at least one memory die further includes one or more memory dies lower than a primary level of the primary memory die.

3. The microcontroller unit according to claim 2, wherein:
the primary memory die is electrically connected to a corresponding electrical interconnection structure in the interconnection dielectric layer through a soldering pad, thereby connecting to the central processing unit; or
the primary memory die is electrically connected to a corresponding electrical interconnection structure in the interconnection dielectric layer through a redistribution structure and a soldering pad, thereby connecting to the central processing unit.

4. The microcontroller unit according to claim 2, wherein:
the primary memory die is bonded to the logic control substrate; and
a first plug is in the primary memory die, and a first redistribution structure, which is electrically connected to the first plug, is formed on an upper surface of the primary memory die; and the first plug is electrically connected to the central processing unit through the electrical interconnection structure in the interconnection dielectric layer; and/or
a second redistribution structure is formed on a lower surface of the primary memory die or on the interconnection dielectric layer; the second redistribution structure is electrically connected to the first plug and is electrically connected to the central processing unit through the electrical interconnection structure in the interconnection dielectric layer.

5. The microcontroller unit according to claim 2, wherein:
the primary memory die is bonded to the logic control substrate; and
a second plug is in the logic control substrate and the second plug is electrically connected to the primary memory die and the central processing unit; or
the second plug is in the logic control substrate, and a third redistribution structure, which is electrically connected to the second plug, is formed on an upper surface of the logic control substrate; the third redistribution structure is electrically connected to the primary memory die and the central processing unit; and/or a fourth redistribution structure, which is electrically connected to the second plug, is formed on a lower surface of the logic control substrate, and the second plug is electrically connected to the primary memory die and the central processing unit.

6. The microcontroller unit according to claim 2, wherein: the primary memory die includes an instruction set memory die.

7. The microcontroller unit according to claim 2, wherein all of the at least one memory die are arranged side by side on the logic control substrate,
the one or more memory dies lower than the primary level are electrically connected to the primary memory die, thereby electrically connecting to the central processing unit through the primary memory die indirectly; or
the one or more memory dies lower than the primary level are electrically connected to corresponding electrical interconnection structures in the interconnection dielectric layer, thereby electrically connecting to the central processing unit or the logic controller.

8. The microcontroller unit according to claim 2, wherein: the one or more memory dies lower than the primary level are stacked on the primary memory die; and
the one or more memory dies lower than the primary level are electrically connected to the primary memory die; and the primary memory die is electrically connected to the central processing unit.

9. The microcontroller unit according to claim 6, wherein: in all of the at least one memory die, the instruction set memory die is soldered onto the interconnection dielectric layer and is closest to the central processing unit, and the instruction set memory die is used for the central processing unit to access instructions; projections of the instruction set memory die and the central processing unit on an upper surface of the interconnection dielectric layer have an overlapped region; and the instruction set memory die and the central processing unit are vertically and electrically connected to each other by the electrical interconnection structure in the interconnection dielectric layer of the overlapped region.

10. The microcontroller unit according to claim 7, wherein:
the primary memory die and the one or more memory dies lower than the primary level are bonded to the logic control substrate; and
a first plug is in the primary memory die and a third plug is in the one or more memory dies lower than the primary level; a first redistribution structure is formed on an upper surface of the primary memory die and the one or more memory dies lower than the primary level; the first distribution structure is electrically connected to the first plug and the third plug; the first plug is electrically connected to the central processing unit through the electrical interconnection structure in the interconnection dielectric layer; and the third plug is electrically connected to the central processing unit or the logic controller through the electrical interconnection structure of the interconnection dielectric layer or is electrically connected to the primary memory die through the first redistribution structure and the first plug; and/or
a second redistribution structure is formed on a lower surface of the primary memory die and lower surfaces of the one or more memory dies lower than the primary level, or the second redistribution structure is formed on the interconnection dielectric layer; the second redistribution structure is electrically connected to the first plug and the third plug; the primary memory die is electrically connected to the electrical interconnection structure in the interconnection dielectric layer through the second redistribution structure, thereby electrically connecting to the central processing unit; the one or more memory dies lower than the primary level are electrically connected to the electrical interconnection structures in the interconnection dielectric layer through the second distribution, thereby electrically connecting to the central processing unit or the logic controller; or the one or more memory dies lower than the primary level are electrically connected to the primary memory die through the third plug, the second redistribution structure and the first plug.

11. The microcontroller unit according to claim 7, wherein:
the primary memory die and the one or more memory dies lower than the primary level are bonded to the logic control substrate; and
a second plug and a fourth plug are in the logic control substrate; the second plug is electrically connected to the primary memory die and the central processing unit; and the fourth plug is electrically connected to the one or more memory dies lower than the primary level and the central processing unit or is electrically connected to the primary memory die and the logic controller; or
a second plug and a fourth plug are in the logic control substrate, and a third redistribution structure electrically connected to the second plug and the fourth plug is formed on an upper surface of the logic control substrate; the primary memory die is electrically connected to the central processing unit through the third redistribution structure, the second plug, and the electrical interconnection structure in the interconnection dielectric layer; the one or more memory dies lower than the primary level are electrically connected to the central processing unit or the logic controller through the third redistribution structure, the fourth plug, and the electrical interconnection structures in the interconnection dielectric layer; or one or more memory dies lower than the primary level are electrically connected to the primary memory die through the third redistribution structure, the fourth plug, and the second plug; and/or, a fourth distribution structure electrically connect to the second plug and the fourth plug is formed on a lower surface of the logic control substrate; the primary memory die is electrically connected to the central processing unit through the second plug and the fourth redistribution structure; and the one or more memory dies lower than the primary level are electrically connected to the central processing unit, the logic controller or the primary memory die through the fourth plug and the fourth redistribution structure.

12. The microcontroller unit according to claim 1, wherein:
the at least one non-memory die includes one or more dies used for implementing basic functions, which are other than control functions, of the microcontroller unit and/or one or more dies implementing extended functions of the microcontroller unit.

13. The microcontroller unit according to claim 12, wherein:
the one or more dies used for implementing basic functions include at least one of radio frequency communication dies, analog-to-digital converter dies, counter dies, or digital-to-analog converter dies; and
the one or more dies used for implementing extended functions include sensor dies.

14. The microcontroller unit according to claim 1, wherein:
the logic control substrate includes a substrate wafer, and the central processing unit and the logic controller are formed on the substrate wafer; the semiconductor device layer includes the substrate wafer, the central processing unit and the logic controller; and the interconnection dielectric layer is formed on the semiconductor device layer.

15. The microcontroller unit according to claim 1, further including:
a carrier, wherein:
a side of the logic control substrate opposite to the interconnection dielectric layer is provided on the carrier, and
one or more back-in functional devices are formed in the carrier.

16. The microcontroller unit according to claim 1, wherein:
the logic controller includes at least one of a logic interface module, a watchdog, or a timer.

17. A method for fabricating a microcontroller unit, comprising:
providing a logic control substrate, wherein the logic control substrate includes a semiconductor device layer and an interconnection dielectric layer stacked sequentially from bottom to top; forming a central processing unit and at least one logic controller in the semiconductor device layer; and forming electrical interconnection structures in the interconnection dielectric layer for respectively leading out the central processing unit and the at least one logic controller;
providing at least one memory die and at least one non-memory die having a non-storage function; disposing all of the at least one memory die on the interconnection dielectric layer side by side or stacked one over another; and disposing all of the at least non-memory die on the interconnection dielectric layer side by side or stacked one over another; and
forming electrical connection structures, wherein the at least one memory die and the least one non-memory die are electrically connected to corresponding electrical interconnection structures respectively, such that the at least one memory die is electrically connected to the central processing unit, and the at least one non-memory die is electrically connected to the corresponding at least one logic controller.

18. The method according to claim 17, wherein:
a corresponding die soldering pad and an electrical interconnection structure corresponding to the die soldering pad in the interconnection dielectric layer are soldered together to form the electrical connection structure; or
a redistribution structure electrically connected to the corresponding electrical interconnection structure in the interconnection dielectric layer is first formed on the interconnection dielectric layer, and then the redistribution structure and the corresponding die soldering pad are soldered together to form the electrical connection structure; or the corresponding die is first bonded to the interconnection dielectric layer, and then a plug is formed in the die and a first redistribution structure electrically connected to the plug is formed on an upper surface of the primary memory die, wherein the plug is electrically connected to the central processing unit or the logic controller through the electrical interconnection structure in the interconnection dielectric layer; and/or,
before the corresponding die is bonded to the interconnection dielectric layer, a second redistribution structure is first formed on a lower surface of the die or the interconnection dielectric layer, and then the plug is formed in the die and electrically connected to the second redistribution structure, wherein the second redistribution structure is electrically connected to the central processing unit or the logic controller through the electrical interconnection structure in the interconnection dielectric layer; or
before the corresponding die is bonded to the interconnection dielectric layer, a plug is first formed in the logic control substrate; and after the corresponding die is bonded to the interconnection dielectric layer, the plug in the logic control substrate is electrically connected to the die and the central processing unit or is electrically connected to the die and the logic controller; or
before the corresponding die is bonded to the interconnection dielectric layer, a plug is first formed in the logic control substrate, and then a third redistribution structure electrically connected to the plug of the logic control substrate is formed on an upper surface of the logic control substrate, wherein the third distribution structure is electrically connected to the die and the central processing unit or is electrically connected to the die and the logic controller; and/or, a fourth redistribution structure is then formed on a lower surface of the logic control substrate, and the fourth redistribution structure is electrically connected to the plug of the logic control substrate, wherein the plug of the logic control substrate is electrically connected to the die and the central processing unit or is electrically connected to the die and the logic controller.

19. The method according to claim 17, wherein providing the logic control substrate includes:
providing a substrate wafer, and forming the central processing unit and the at least one logic controller on the substrate wafer, thereby forming the semiconductor device layer including the central processing unit and the at least one the logic controller;
forming the interconnection dielectric layer on the semiconductor device layer, wherein the interconnection dielectric layer covers the central processing unit and each logic controller; and respectively forming electrical interconnection structures for leading out the central processing unit and the at least one logic controller in the interconnection dielectric layer, thereby forming the logic control substrate having the substrate wafer, the semiconductor device layer and the interconnection dielectric layer; and
providing a carrier, wherein a side of the logic control substrate opposite to the interconnection dielectric layer is provided on the carrier.

20. The method according to claim 19, wherein:
before or after providing the logic control substrate onto the carrier, one or more back-in functional devices are formed in the carrier.

* * * * *